(12) United States Patent
Okamoto et al.

(10) Patent No.: US 12,431,719 B2
(45) Date of Patent: Sep. 30, 2025

(54) SEMICONDUCTOR DEVICE AND OPERATING METHOD OF SEMICONDUCTOR DEVICE

(71) Applicant: SEMICONDUCTOR ENERGY LABORATORY CO., LTD., Atsugi (JP)

(72) Inventors: Yuki Okamoto, Kanagawa (JP); Takahiko Ishizu, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1203 days.

(21) Appl. No.: 17/269,330

(22) PCT Filed: Aug. 21, 2019

(86) PCT No.: PCT/IB2019/057027
§ 371 (c)(1),
(2) Date: Feb. 18, 2021

(87) PCT Pub. No.: WO2020/044168
PCT Pub. Date: Mar. 5, 2020

(65) Prior Publication Data
US 2021/0242690 A1 Aug. 5, 2021

(30) Foreign Application Priority Data

Aug. 31, 2018 (JP) .................. 2018-163168
Oct. 25, 2018 (JP) .................. 2018-201005
(Continued)

(51) Int. Cl.
*H02J 7/00* (2006.01)
*H01L 27/12* (2006.01)
(Continued)

(52) U.S. Cl.
CPC ........ *H02J 7/0014* (2013.01); *H01L 27/1207* (2013.01); *H01L 27/1225* (2013.01);
(Continued)

(58) Field of Classification Search
CPC ...................................................... H02J 7/0013
See application file for complete search history.

(56) References Cited

U.S. PATENT DOCUMENTS 5,850,136 A * 12/1998 Kaneko ................. H02J 7/0016
320/122
5,932,990 A * 8/1999 Kaneko ................. H02J 7/0016
320/122
(Continued)

FOREIGN PATENT DOCUMENTS

CN 101860066 A 10/2010
JP 2006-211885 A 8/2006
(Continued)

OTHER PUBLICATIONS

International Search Report (Application No. PCT/IB2019/057027) Dated Nov. 19, 2019.
(Continued)

*Primary Examiner* — Tynese V McDaniel
(74) *Attorney, Agent, or Firm* — Fish & Richardson P.C.

(57) ABSTRACT

To provide a battery control circuit with a novel structure, a battery protection circuit with a novel structure, and a power storage device including the battery circuit. The semiconductor device includes n cell-balance circuits (n is an integer greater than or equal to 1). One secondary battery is electrically connected to one cell-balance circuit. The cell-balance circuit includes a comparison circuit, and a memory element is electrically connected to an inverting input terminal of the comparison circuit. The memory element includes a first transistor and a capacitor. A potential is
(Continued)

retained. The retained potential changes in accordance with a change in a potential of a negative electrode of the secondary battery. The comparison circuit has a function of comparing the retained potential with a potential of a positive electrode of the secondary battery. Output from the comparison circuit controls a gate voltage of a second transistor electrically connected to the secondary battery in parallel. The first transistor includes a metal oxide including indium in a channel formation region.

8 Claims, 24 Drawing Sheets

(30) Foreign Application Priority Data

Nov. 22, 2018 (JP) .................................. 2018-219225
Dec. 21, 2018 (JP) .................................. 2018-239852

(51) Int. Cl.
*H01L 29/786* (2006.01)
*H01M 10/42* (2006.01)
*H01M 10/44* (2006.01)
*H01M 10/48* (2006.01)

(52) U.S. Cl.
CPC ...... *H01L 29/7869* (2013.01); *H01M 10/425* (2013.01); *H01M 10/441* (2013.01); *H01M 10/48* (2013.01); *H01M 2010/4271* (2013.01)

(56) References Cited

U.S. PATENT DOCUMENTS

| | | | | |
|---|---|---|---|---|
| 5,998,967 A * | 12/1999 | Umeki | ................ | H02J 7/0016 320/122 |
| 7,609,030 B2 | 10/2009 | Uesugi et al. | | |
| 7,741,811 B2 * | 6/2010 | Daio | ................ | H02J 50/402 320/122 |
| 8,471,526 B2 | 6/2013 | Kanno | | |
| 8,749,204 B2 | 6/2014 | Majima et al. | | |
| 9,742,356 B2 | 8/2017 | Takahashi et al. | | |
| 10,560,056 B2 | 2/2020 | Takahashi et al. | | |
| 2005/0127873 A1* | 6/2005 | Yamamoto | ............ | H02J 7/0016 320/116 |
| 2005/0185361 A1* | 8/2005 | Yano | ................ | H02J 7/0016 361/328 |
| 2006/0103351 A1* | 5/2006 | Tanigawa | ............ | H02J 7/0016 320/118 |
| 2006/0139004 A1* | 6/2006 | Uesugi | ................ | H02J 7/0016 320/132 |
| 2010/0239896 A1* | 9/2010 | Kanno | ................ | H01M 50/569 429/92 |
| 2010/0253285 A1* | 10/2010 | Takahashi | .......... | H02J 7/00038 320/134 |
| 2011/0187329 A1 | 8/2011 | Majima et al. | | |
| 2011/0260687 A1* | 10/2011 | Kudo | ................ | H01M 10/441 320/118 |
| 2011/0267726 A1 | 11/2011 | Ikeuchi et al. | | |
| 2012/0206105 A1* | 8/2012 | Nishizawa | .......... | H01M 10/482 320/134 |
| 2013/0242446 A1* | 9/2013 | Oshima | ................ | H02H 3/207 361/86 |
| 2013/0257443 A1* | 10/2013 | Suzuki | ................ | G01R 31/396 324/433 |
| 2013/0271220 A1* | 10/2013 | Takahashi | ............ | H03F 1/0261 330/293 |
| 2014/0167684 A1* | 6/2014 | Miyanaga | ............ | H02J 7/0016 320/162 |
| 2014/0266051 A1* | 9/2014 | Hayakawa | ............ | H02J 7/0016 320/118 |
| 2016/0006433 A1* | 1/2016 | Ishizu | ................ | H03K 17/687 327/427 |
| 2016/0036248 A1* | 2/2016 | Hamada | ................ | B60L 3/0046 320/166 |
| 2016/0043715 A1* | 2/2016 | Kurokawa | ............ | H03K 17/687 327/434 |
| 2016/0126888 A1* | 5/2016 | Okamoto | ............ | H03K 3/0315 331/108 R |
| 2018/0277818 A1* | 9/2018 | Nagai | ................ | H01M 50/516 |
| 2020/0177132 A1 | 6/2020 | Takahashi et al. | | |
| 2021/0126473 A1* | 4/2021 | Ikeda | ................ | H01M 10/4235 |
| 2021/0190471 A1 | 6/2021 | Ikeda et al. | | |
| 2021/0294367 A1 | 9/2021 | Takahashi et al. | | |
| 2021/0384751 A1* | 12/2021 | Takahashi | .......... | H02J 7/007182 |
| 2022/0085073 A1* | 3/2022 | Onuki | ................ | H01L 27/06 |
| 2022/0094177 A1* | 3/2022 | Okamoto | ............ | H01M 10/48 |
| 2023/0100524 A1* | 3/2023 | Ikeda | ................ | H01M 50/574 429/7 |

FOREIGN PATENT DOCUMENTS

| | | |
|---|---|---|
| JP | 2010-066161 A | 3/2010 |
| JP | 2010-220389 A | 9/2010 |
| JP | 2010-246225 A | 10/2010 |
| JP | 2016-219028 A | 12/2016 |
| KR | 2013-0115131 A | 10/2013 |

OTHER PUBLICATIONS

Written Opinion (Application No. PCT/IB2019/057027) Dated Nov. 19, 2019.

\* cited by examiner

SEMICONDUCTOR DEVICE AND OPERATING METHOD OF SEMICONDUCTOR DEVICE

CROSS REFERENCE TO RELATED APPLICATIONS

This application is a U.S. National Phase Application under 35 U.S.C. § 371 of International Application PCT/IB2019/057027, filed on Aug. 21, 2019, which is incorporated by reference and claims the benefit of foreign priority applications filed in Japan on Aug. 31, 2018, as Application No. 2018-163168, on Oct. 25, 2018, as Application No. 2018-201005, on Nov. 22, 2018, as Application No. 2018-219225, and on Dec. 21, 2018, as Application No. 2018-239852.

TECHNICAL FIELD

One embodiment of the present invention relates to a semiconductor device and an operating method of the semiconductor device. One embodiment of the present invention relates to a battery control circuit, a battery protection circuit, a power storage device, and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

BACKGROUND ART

Power storage devices (also referred to as batteries or secondary batteries) have been utilized in a wide range of areas from small electronic devices to automobiles. As the application range of batteries expands, the number of applications each with a multi-cell battery stack where a plurality of battery cells are connected in series increases.

The power storage device is provided with a circuit for detecting an abnormality at charge and discharge, such as overdischarge, overcharge, overcurrent, or a short circuit. In such a circuit performing protection and control of a battery, data of a voltage, a current, and the like is obtained in order to detect the abnormality at charge and discharge. Also in such a circuit, stop of charge and discharge, cell balance, and the like are controlled in accordance with the observed data.

Patent Document 1 discloses a protective IC that functions as a battery protection circuit. In the protective IC described in Patent Document 1, a plurality of comparators are provided, and a reference voltage and a voltage of a terminal to which a battery is connected are compared to detect an abnormality at charge and discharge.

Patent Document 2 discloses a battery state detector that detects a micro-short circuit of a secondary battery and a battery pack incorporating the same.

Patent Document 3 discloses a protection semiconductor device for protecting an assembled battery in which secondary battery cells are connected in series.

REFERENCE

Patent Document

[Patent Document 1] Specification of United States Patent Application Publication No. 2011-267726
[Patent Document 2] Japanese Published Patent Application No. 2010-66161
[Patent Document 3] Japanese Published Patent Application No. 2010-220389

SUMMARY OF THE INVENTION

Problems to be Solved by the Invention

An object of one embodiment of the present invention is to provide a novel battery control circuit, a novel battery protection circuit, a novel power storage device, a novel electronic device, and the like. Another object of one embodiment of the present invention is to provide a battery control circuit, a battery protection circuit, a power storage device, an electronic device, and the like which can reduce the power consumption.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted from the description by those skilled in the art. Note that one embodiment of the present invention is to solve at least one of the description listed above and/or the other objects.

Means for Solving the Problems

One embodiment of the present invention is a semiconductor device including n cell-balance circuits (n is an integer greater than or equal to 1). One secondary battery is electrically connected to one cell-balance circuit. The cell-balance circuit includes a comparison circuit, and a memory element is electrically connected to an inverting input terminal of the comparison circuit. The memory element includes a first transistor and a capacitor. A potential is retained. The retained potential changes in accordance with a change in a potential of a negative electrode of the secondary battery. The comparison circuit has a function of comparing the retained potential with a potential of a positive electrode of the secondary battery. Output from the comparison circuit controls a gate voltage of a second transistor electrically connected to the secondary battery in parallel. The first transistor includes a metal oxide including indium in a channel formation region.

One embodiment of the present invention is a semiconductor device including n cell-balance circuits (n is an integer greater than or equal to 1). One secondary battery is electrically connected to one cell-balance circuit. The cell-balance circuit includes a comparator, and a memory element is electrically connected to an inverting input terminal of the comparator. The memory element includes a first transistor and a capacitor. A potential is retained. The retained potential changes in accordance with a change in a potential of a negative electrode of the secondary battery. The comparator has a function of comparing the retained potential with a potential of a positive electrode of the secondary battery. Output from the comparator controls a gate voltage of a second transistor electrically connected to the secondary battery in parallel. The first transistor includes a metal oxide including indium in a channel formation region.

One embodiment of the present invention is a semiconductor device including n cell-balance circuits (n is an integer greater than or equal to 1). The n cell-balance circuits are electrically connected to n secondary batteries. One secondary battery is electrically connected to one of the n cell-balance circuits. Each of the n cell-balance circuits includes a first comparison circuit, a first terminal electrically connected to a non-inverting input terminal of the first comparison circuit, a first transistor one of a source and a drain of which is electrically connected to an inverting input terminal of the first comparison circuit, a first capacitor one electrode of which is electrically connected to the inverting input terminal of the first comparison circuit, and a second terminal electrically connected to the other electrode of the first capacitor. The first transistor includes a metal oxide including indium in a channel formation region. The first terminal included in a k-th cell-balance circuit (k is an integer greater than or equal to 3 and less than or equal to n) is electrically connected to the second terminal included in a (k−1)th cell-balance circuit. The first terminal included in the (k−1)th cell-balance circuit is electrically connected to the second terminal included in a (k−2)th cell-balance circuit. A positive electrode of the secondary battery electrically connected to the k-th cell-balance circuit is electrically connected to the first terminal of the k-th cell-balance circuit, and a negative electrode thereof is electrically connected to the second terminal of the k-th cell-balance circuit.

In the above structure, in the case where a voltage difference between the first terminal and the second terminal included in an m-th cell-balance circuit (m is an integer greater than or equal to 2 and less than or equal to n) is larger than a voltage difference between the first terminal and the second terminal included in an (m−1)th cell-balance circuit, it is preferable that a high-potential signal be output from an output terminal of the comparison circuit included in the m-th cell-balance circuit and a low-potential signal be output from an output terminal of the comparison circuit included in the (m−1)th cell-balance circuit. Also in the above structure, each of the n cell-balance circuits preferably has a function of supplying the sum of a voltage of the second terminal and a voltage A to the inverting input terminal of the comparison circuit, and the voltage A is preferably greater than or equal to 3 V and less than or equal to 5 V.

One embodiment of the present invention is a method of operating a semiconductor device. The semiconductor device includes a first comparison circuit, a first transistor, a first capacitor, a first terminal, a second terminal, and a third terminal. The first terminal is electrically connected to a non-inverting input terminal of the first comparison circuit. One of a source and a drain of the first transistor and one electrode of the first capacitor are electrically connected to an inverting input terminal of the first comparison circuit. The second terminal is electrically connected to the other electrode of the first capacitor. The third terminal is electrically connected to the other of the source and the drain of the first transistor. The first transistor includes a metal oxide in a channel formation region. The metal oxide includes indium. A positive electrode terminal of a secondary battery is electrically connected to the first terminal. A negative electrode terminal of the secondary battery is electrically connected to the second terminal. The method has a first step of supplying a high-potential signal to a gate of the first transistor, a second step of supplying a first signal to the third terminal, a third step of supplying a second signal in accordance with the first signal to the inverting input terminal of the first comparison circuit, a fourth step of supplying a low-potential signal to a gate of the first transistor, a fifth step of outputting a low-potential signal from an output terminal of the first comparison circuit, and a sixth step of reducing a current of the secondary battery by changing a signal from the output terminal of the first comparison circuit from the low-potential signal to the high-potential signal. The first signal is the sum of a voltage of the second terminal and a voltage A, and the voltage A is greater than or equal to 3 V and less than or equal to 5 V.

In the above structure, a voltage difference between the first terminal and the second terminal in the fifth step is preferably smaller than a voltage difference between the first terminal and the second terminal in the sixth step. In the above structure, it is preferable that the semiconductor device include a second transistor, the first terminal or the second terminal be electrically connected to one of a source and a drain of the second transistor, and the output terminal of the first comparison circuit be electrically connected to a gate of the second transistor. In the above structure, the second signal supplied to the non-inverting input terminal of the first comparison circuit in the third step is preferably retained in the fourth step to the sixth step. In the above structure, it is preferable that the semiconductor device include a voltage generation circuit, the voltage generation circuit include a third transistor and a second capacitor, one electrode of the second capacitor be electrically connected to one of a source and a drain of the third transistor, the second terminal be electrically connected to the other of the source and the drain of the third transistor, the voltage generation circuit have a function of generating the first signal, and the third transistor include a metal oxide including indium in a channel formation region. In the above structure, it is preferable that the voltage generation circuit include a second comparison circuit, one of the source and the drain of the third transistor be electrically connected to a non-inverting input terminal of the second comparison circuit, the third terminal be electrically output to an inverting input terminal of a third comparison circuit, and a gate of the first transistor be electrically connected to an output terminal of the third comparison circuit.

Another embodiment of the present invention is a semiconductor device including a first comparison circuit, a second comparison circuit, a third comparison circuit, a control circuit, and a secondary battery. The first comparison circuit, the second comparison circuit, and the third comparison circuit have a function of supplying a signal to the control circuit. The control circuit has a function of controlling a charge current for the secondary battery in accordance with a signal supplied from the first comparison circuit. The control circuit has a function of stopping charge of the secondary battery in accordance with a signal supplied from the second comparison circuit. The control circuit has a function of controlling an upper charge voltage limit of the secondary battery in accordance with a signal supplied from the third comparison circuit. The first comparison circuit has a function of comparing a potential of a positive electrode of the secondary battery with a first reference potential. The second comparison circuit has a function of comparing the potential of the positive electrode of the secondary battery with a second reference potential. The third comparison circuit has a function of comparing an ambient temperature with a third reference potential.

In the above structure, it is preferable that a source or a drain of a first transistor be electrically connected to a non-inverting input terminal or an inverting input terminal of the first comparison circuit, a source or a drain of a second transistor be electrically connected to a non-inverting input terminal or an inverting input terminal of the second comparison circuit, a source or a drain of a third transistor be electrically connected to a non-inverting input terminal or an inverting input terminal of the third comparison circuit, and a channel formation region of each of the first transistor, the second transistor, and the third transistor include a metal oxide including indium.

Effect of the Invention

One embodiment of the present invention can provide a novel battery control circuit, a novel battery protection circuit, a novel power storage device, a novel electronic device, or the like. Another embodiment of the present invention can provide a battery control circuit, a battery protection circuit, a power storage device, an electronic device, or the like with a novel structure capable of reducing power consumption.

Note that the effects of one embodiment of the present invention are not limited to the effects listed above. The effects listed above do not preclude the existence of other effects. Note that the other effects are effects that are not described in this section and will be described below. The other effects that are not described in this section will be derived from the description of the specification, the drawings, and the like and can be extracted from the description by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1:
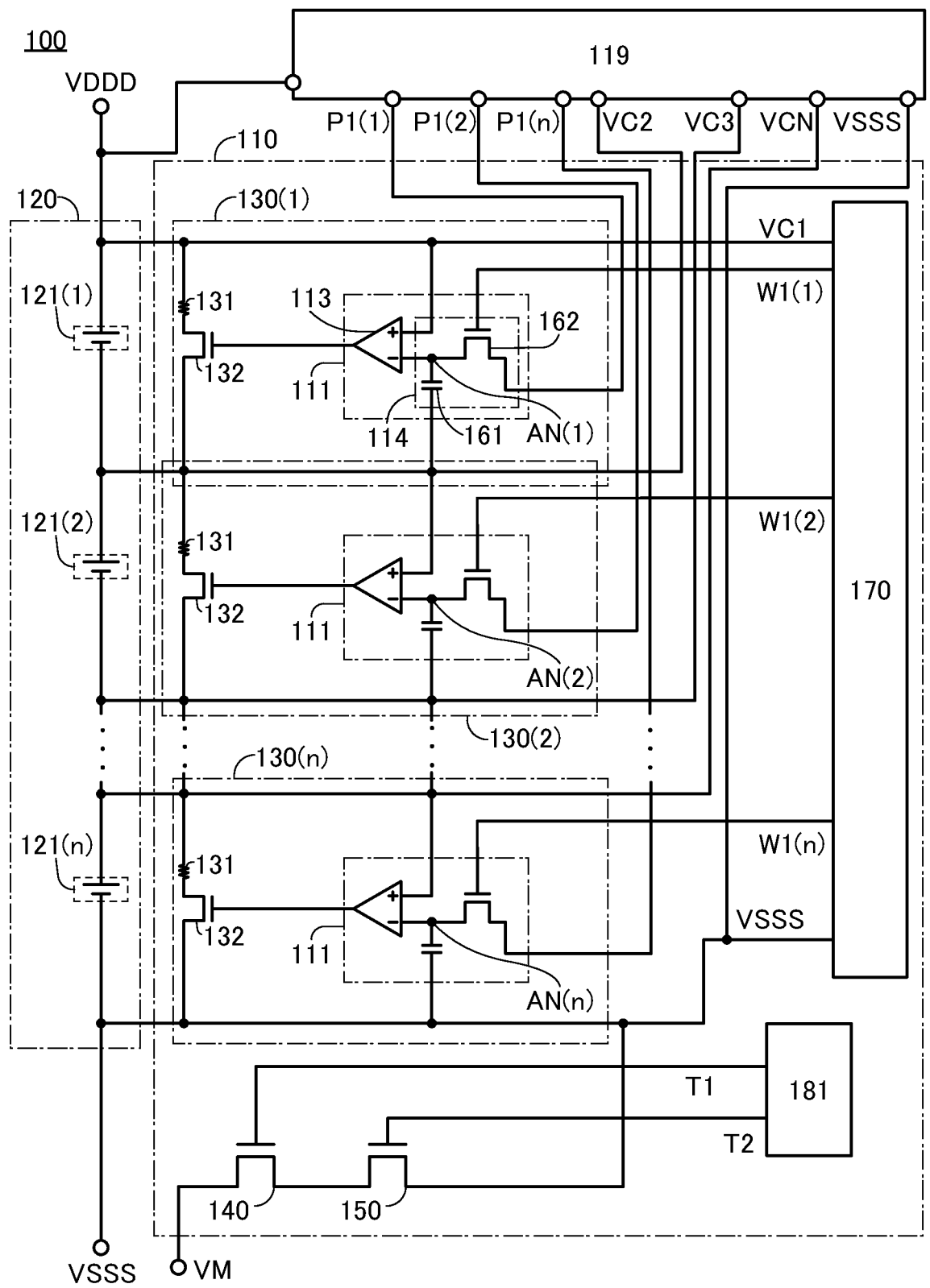
FIG. 1 is a block diagram illustrating one embodiment of the present invention.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In this specification and the like, the term such as "electrode" or "wiring" does not limit the function of a component. For example, an "electrode" is used as part of a "wiring" in some cases, and vice versa. Furthermore, the term "electrode" or "wiring" can also mean a combination of a plurality of electrodes or wirings provided in an integrated manner, for example.

Note that the term "over" or "under" in this specification and the like does not necessarily mean that a component is placed directly over and in contact with or directly under and in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, the term "parallel" indicates that the angle formed between two straight lines is greater than or equal to −10° and less than or equal to 10°, for example, and accordingly also includes the case where the angle is greater than or equal to −5° and less than or equal to 5°. The terms "perpendicular" and "orthogonal" indicate that the angle formed between two straight lines is greater than or equal to 80° and less than or equal to 100°, for example, and accordingly also includes the case where the angle is greater than or equal to 85° and less than or equal to 95°.

In this specification and the like, the terms "identical", "same", "equal", "uniform", and the like used in describing calculation values and actual measurement values allow for a margin of error of ±20% unless otherwise specified.

Furthermore, in this specification and the like, in the case where an etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state, and "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

Structures of a battery control circuit and a power storage device including the battery control circuit will be described with reference to FIG. 1 and FIG. 2.

A battery control circuit of one embodiment of the present invention or a power storage device including the battery control circuit is called "BTOS" in some cases. "BTOS" can build a system with low power consumption in some cases. "BTOS" can build a system with a simple circuit in some cases.

The battery control circuit of one embodiment of the present invention preferably has a function of protecting a battery. The battery control circuit of one embodiment of the present invention is called a battery protection circuit in some cases.

Example 1 of Power Storage Device

FIG. 1 illustrates an example of a power storage device. A power storage device 100 illustrated in FIG. 1 includes a battery control circuit 110 and an assembled battery 120.

The assembled battery 120 includes a plurality of battery cells 121. FIG. 1 illustrates an example in which n battery cells 121 are included. A k-th battery cell (k is an integer greater than or equal to 1 and less than or equal to n) is represented by a battery cell 121(k) in some cases. The plurality of battery cells included in the assembled battery 120 are electrically connected in series.

Here, as the battery cell, a secondary battery of an embodiment described later can be used, for example. For example, a secondary battery including a wound battery element can be used. Furthermore, the battery cell preferably includes an exterior body. For example, a cylindrical exterior body, a rectangular exterior body, or the like can be used. As a material for the exterior body, a metal plate covered with an insulator, a metal film sandwiched between insulators, or the like can be used. The battery cell includes a set of positive and negative electrodes, for example. The battery cell may include a terminal electrically connected to the positive electrode and a terminal electrically connected to the negative electrode. In some cases, the battery cell includes some components of the battery control circuit of one embodiment of the present invention.

The battery control circuit 110 includes n cell-balance circuits 130, a transistor 140, a transistor 150, a detection circuit 181, and a control circuit 170. The n cell-balance circuits 130 are collectively called a cell-balance control unit in some cases.

The control circuit 170 has functions of transmitting and receiving signals to/from the n cell-balance circuits 130. The control circuit 170 has functions of transmitting and receiving signals to/from an external circuit. In some cases, the control circuit 170 includes a voltage generation circuit.

One cell-balance circuit 130 that corresponds to one battery cell 121 includes a voltage comparison unit 111 including a comparator 113 and a memory element 114, and a transistor 132. The memory element 114 includes a capacitor 161 and a transistor 162. One of a source and a drain of the transistor 162 is electrically connected to a terminal P1, and the other thereof is electrically connected to one electrode of the capacitor 161. Note that the potential of the terminal P1 differs depending on the corresponding battery cell. The cell-balance circuit 130 corresponding to a battery cell 121(k) is called a cell-balance circuit 130(k), and the terminal P1 included in the cell-balance circuit 130(k) is called a terminal P1(k). A gate of the transistor 162 is electrically connected to a terminal W1. A first terminal (referred to as a terminal VC1 in the case of a first battery cell, a terminal VC2 in the case of a second battery cell, and a terminal VCN in the case of an n-th battery cell) is electrically connected to a positive electrode of one battery cell 121, and a second terminal (referred to as a terminal VC2 in the case of the first battery cell, a terminal VC3 in the case of the second battery cell, and a terminal VSSS in the case of an n-th cell) is electrically connected to a negative electrode of the battery cell 121. One of a source and a drain of the transistor 132 is electrically connected to the first terminal and the other thereof is electrically connected to the second terminal. A non-inverting input terminal of the comparator 113 is electrically connected to the first terminal. A gate of the transistor 132 is electrically connected to an output terminal of the comparator 113. One electrode of the capacitor 161 is electrically connected to an inverting input terminal of the comparator 113, and the other electrode thereof is electrically connected to the second terminal.

The cell-balance circuit 130 may include a resistor 131 between the one of the source and the drain of the transistor 132 and a terminal electrically connected to the positive electrode of the battery cell, or between the other of the source and the drain of the transistor 132 and a terminal electrically connected to the negative electrode of the battery cell. In the example illustrated in FIG. 1, the resistor 131 may be provided between the one of the source and the drain of the transistor 132 and the terminal electrically connected to the positive electrode of the battery cell.

As to two adjacent battery cells 121, in the case where a negative electrode of a first battery cell 121 is electrically connected to a positive electrode of a second battery cell 121, a terminal connected to the negative electrode of the first battery cell 121 and a terminal connected to the positive electrode of the second battery cell 121 are common, for example.

The terminals W1 which correspond to the respective battery cells 121 are supplied with signals by the control circuit 170.

The terminal P1(k) is supplied with voltage Vr(k). The voltage Vr(k) is a variable voltage, for example. Alternatively, the voltage Vr(k) may be a fixed voltage. A circuit for generating and controlling the voltage Vr(k) may be provided separately from the battery control circuit 110, or the battery control circuit 110 may have a function of generating and/or controlling the voltage Vr(k).

As the transistor 162, a transistor including an oxide semiconductor in its channel formation region (hereinafter referred to as an OS transistor) is preferably used. In one embodiment of the present invention, with the use of a memory element including an OS transistor, a desired voltage can be retained in the memory element because a leakage current flowing between a source and a drain when the transistor is off (hereinafter referred to as an off-state current) is extremely low.

The memory element 114 has a function of supplying the voltage Vr(k) supplied from the terminal P1(k) or voltage corresponding to the voltage Vr(k) to the inverting input terminal of the comparator 113. Furthermore, when the voltage Vr(k) reaches a certain voltage (for example, Vm(k) described later), the memory element 114 has a function of making the inverting input terminal of the comparator 113 retain the voltage.

The terminal P1(k) has a function of supplying the sum (hereinafter referred to as voltage Vm(k)) of the voltage of the negative electrode of the corresponding battery cell 121(k) (hereinafter referred to as voltage Vn(k)) and voltage Vc, which is a voltage to be supplied as a difference in voltage between the positive electrode and the negative electrode of the battery cell 121, to the inverting input terminal of the comparator 113. In FIG. 1, a voltage Vn(1) is a voltage of the terminal VC2, and a voltage Vm(1), which is a potential supplied to a terminal P1(1), is the sum of the voltage of the terminal VC2 and the voltage Vc. The voltage Vn(2) is a voltage of the terminal VC3, and a voltage Vm(2), which is a potential supplied to a terminal P1(2), is the sum of the voltage of the terminal VC3 and the voltage Vc.

A voltage generation circuit 119 is preferably electrically connected to the terminal P1(k). Negative electrodes of the battery cells 121 are electrically connected to the voltage generation circuit 119. The voltage generation circuit 119 has a function of generating the voltage Vm(k) as the sum of the voltage Vc and the voltage Vn(k) used as a reference. Note that the voltages Vn are different between the battery cells 121. Accordingly, different voltages Vm are generated. That is, voltage supplied to the terminal P1(k) is different depending on the battery cell 121, for example. The voltage generation circuit 119 or part thereof may be included in the cell-balance circuit 130.

When the transistor 162 is turned off and a node AN connected to the inverting input terminal of the comparator 113 is brought into an electrically insulating state, the voltage Vm can be retained in the node AN. The node AN is connected to the negative electrode of the battery cell 121 through the capacitor 161. Thus, in the case where the potentials of the negative electrodes of the battery cells 121 vary in accordance with charge and discharge of the cells, the potentials of the nodes AN also vary. At this time, the potential of the node AN varies to be the sum of the Vc and the potential of the negative voltage of the corresponding battery cell 121 used as a reference. Note that the node AN corresponding to the terminal P1(k) is referred to as anode AN(k) in some cases.

The comparator 113 compares the voltage of the positive electrode of the battery cell 121(k) and the voltage Vm(k), and outputs a high-potential signal from the output terminal when the voltage of the positive electrode matches with the voltage Vm(k). The high-potential signal supplied to the transistor 132 turns on the transistor 132, and part or most of current flowing through the battery cell 121 can flow to the transistor 132. For example, by turning on the transistor 132, a charge current for the battery cell 121 can be limited or charge can be stopped.

That is, the cell-balance circuit included in the power storage device of one embodiment of the present invention can monitor the voltage of the battery cell and limit the charge current at a certain voltage.

The voltage Vn is, for example, the voltage of the terminal VC2 in the case of the first battery cell 121, and is the voltage of the terminal VC3 in the case of the second battery cell 121.

A terminal VDDD and the terminal VSSS are electrically connected to the both ends of the assembled battery 120. A charge control circuit is preferably electrically connected to the terminal VDDD and the terminal VSSS. The charge control circuit may be provided separately from the battery control circuit 110, or the battery control circuit 110 may have a function of controlling charge.

A coulomb counter is preferably electrically connected to the terminal VDDD and the terminal VSSS. The coulomb counter may be provided separately from the battery control circuit 110, or the battery control circuit 110 may have a function of the coulomb counter.

The cell-balance circuits 130 to which the plurality of battery cells 121 are connected have a function of controlling a difference between voltages of the both ends (a voltage difference between the positive electrode and the negative electrode) of the corresponding battery cell 121. The cell-balance circuit 130 for each battery cell 121 can make the memory element 114 retain a preferable value as the upper limit voltage of the positive electrode. Furthermore, the cell-balance circuit 130 controls whether the transistor 132 is turned on or turned off in accordance with the relation between the voltage of the positive electrode of the battery cell 121 and the voltage of the non-inverting input terminal of the comparator 113. The control of the transistor 132 can adjust the ratio between the amount of current flowing through the resistor 131 and the amount of current flowing through the battery cell 121. For example, in the case where charge of the battery cell 121 is stopped, a current is made to flow to the resistor 131 and a current flowing to the battery cell 121 is limited.

In FIG. 1, the plurality of battery cells 121 are electrically connected in series between the terminal VDDD and the terminal VSSS. By making a current flow between the terminal VDDD and the terminal VSSS, the plurality of battery cells 121 are charged.

The case where the positive electrode of one battery cell 121 among the plurality of battery cells 121 reaches a certain voltage and a current is limited is considered. In such a case, a current flows through the transistor 132 and the resistor 131 which are connected in parallel to the battery cell, whereby charge of the other battery cells 121 whose positive electrodes do not reach the certain voltage can be continued without interruption of a current path between the terminal VDDD and the terminal VSSS. In other words, in the battery cell 121 where the charge is completed, the charge is stopped by turning on the transistor 132, and in the battery cell 121 where the charge is not completed, the charge is continued by turning off the transistor 132.

In the case where the battery cells 121 have different resistances, charge of a battery cell 121 with low resistance might be completed first, and charge of a battery cell 121 with high resistance might be insufficient. Here, insufficient charge means that, for example, the voltage difference between the positive electrode and the negative electrode is lower than a desired voltage. With the use of the cell-balance circuit 130, the voltage of the positive electrode of the battery cell 121 during charge can be monitored using the voltage of the negative electrode of the battery cell as a reference.

In other words, the use of the n cell-balance circuits 130 can reduce variations of states of the plurality of battery cells 121 after being charged, for example, when being fully charged. Thus, the capacitance of the assembled battery 120 as a whole is increased in some cases. The increase in capacitance can reduce the number of charge and discharge cycles of the battery cell 121 in some cases, which may increase the durability of the assembled battery 120.

Figure 2:
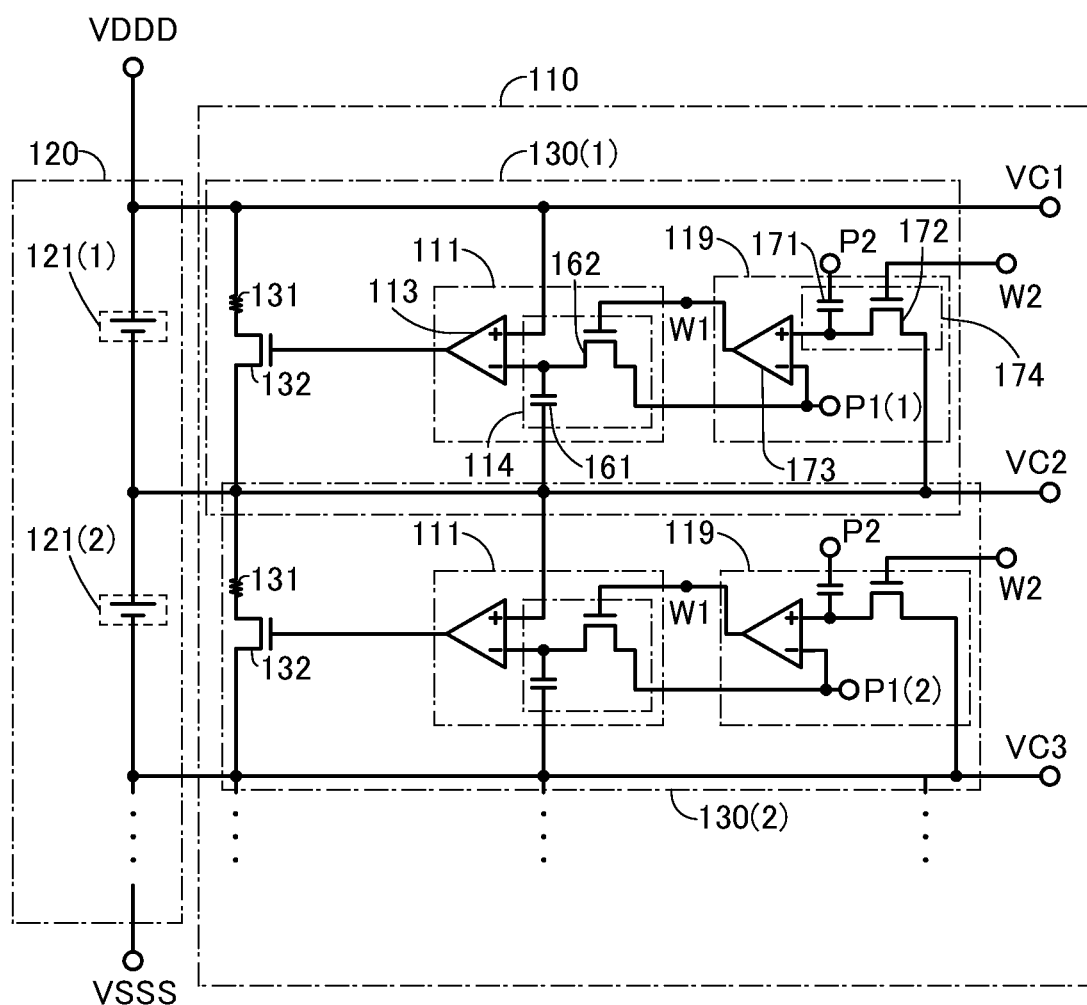
FIG. 2 is a block diagram illustrating one embodiment of the present invention.

FIG. 2 illustrates an example in which the cell-balance circuit 130 in the power storage device 100 includes the voltage generation circuit 119. Although some components illustrated in FIG. 1, such as the control circuit 170, are omitted for simplicity, the cell-balance circuit 130 illustrated in FIG. 2 can include the components illustrated in FIG. 1. In the power storage device 100 in the example illustrated in FIG. 2, for each battery cell 121, the corresponding voltage generation circuit 119 is provided.

The voltage generation circuit 119 illustrated in FIG. 2 includes a memory element 174 and a comparator 173. The memory element 174 includes a capacitor 171 and a transistor 172. One of a source and a drain of the transistor 172 and one electrode of the capacitor 171 are electrically connected to a non-inverting input terminal of the comparator 173. The other electrode of the capacitor 171 is electrically connected to a terminal P2. Agate of the transistor 172 is electrically connected to a terminal W2. The other of the source and the drain of the transistor 172 is electrically connected to a terminal connected to the negative electrode of the corresponding battery cell 121. An output terminal of the comparator 173 is electrically connected to the terminal W1, that is, the gate of the transistor 162 included in the voltage comparison unit 111. The terminal P1($k$) is electrically connected to an inverting input terminal of the comparator 173.

The description of the memory element 114 may be referred to for the memory element 174, for example.

An OS transistor is preferably used as the transistor 172. With the use of an OS transistor as the transistor 172, thanks to its extremely low leakage current which flows between a source and a drain when the transistor is off (hereinafter referred to as an off-state current), data can be stored in the memory element 174 in the case where the transistor 172 is turned off Thus, a desired voltage can be retained in the non-inverting input terminal of the comparator 173.

Operation Example 1

Figure 3:
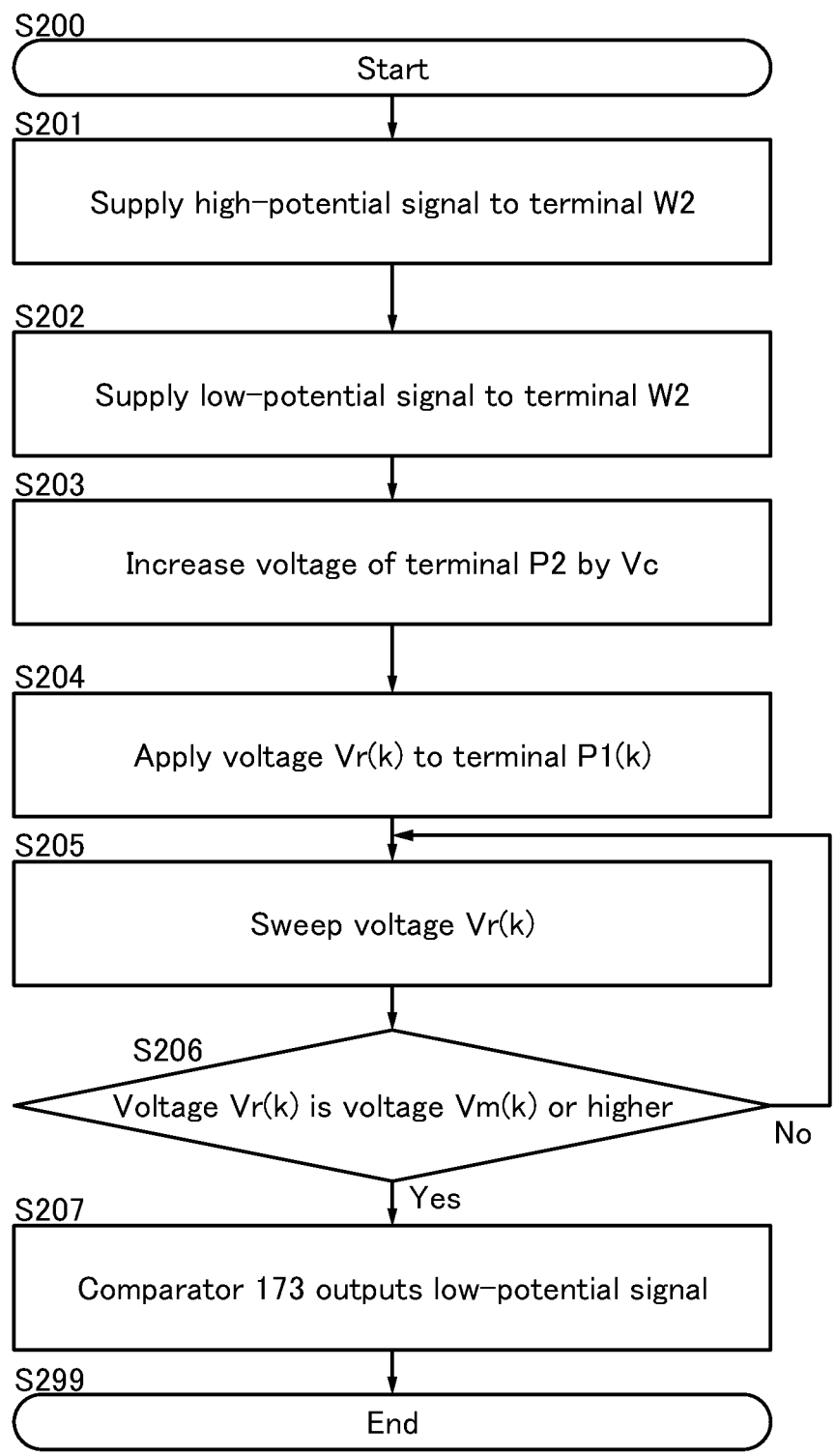
FIG. 3 is a flow chart showing one embodiment of the present invention.

The voltage generation circuit 119 can generate a reference voltage of the positive electrode, for example, the voltage Vm(k), using the voltage of the negative electrode of the battery cell 121($k$), for example, the voltage Vn(k), as a reference in a manner described below with reference to FIG. 3. An example in which the voltage Vm(k) is generated as the sum of the voltage Vc and the voltage Vn(k) used as a reference is described below.

First, the processing starts in Step S200.

Next, in Step S201, a high-potential signal is supplied to the terminal W2. By application of the high-potential signal to the terminal W2, the transistor 172 is turned on. When the transistor 172 is turned on, the voltage Vn can be applied to the non-inverting input terminal of the comparator 173.

Next, in Step S202, a low-potential signal is supplied to the terminal W2. By supply of the low-potential signal to the terminal W2, the transistor 172 is turned off.

Next, in Step S203, the voltage of the terminal P2 is increased by the voltage Vc. For example, when the terminal P2 is a ground potential, the terminal P2 may be the voltage Vc. When the voltage of the terminal P2 is increased, the voltage of the non-inverting input terminal of the comparator 173 is increased by the voltage Vc due to capacitive coupling through the capacitor 171. That is, the voltage of the non-inverting input terminal of the comparator 173 can be the voltage Vm(k) which is the sum of the voltage Vn and the voltage Vc.

As described above, the voltage generation circuit 119 can generate the voltage Vm(k) and can retain the voltage in the non-inverting input terminal. Here, the voltage Vn of the negative electrode of the battery cell 121 differs depending on the charging rate of the battery cell 121. Thus, in the case where the voltage Vm is generated by the above-described method, the difference in charging rate between the plurality of battery cells 121 is preferably small. The voltage Vc is preferably set in accordance with the charging rate of the battery cell 121.

Next, an example in which a desired voltage is applied to the inverting input terminal of the comparator 113 included in the voltage comparison unit 111 with the use of the voltage generation circuit 119 is described.

First, in Step S204, the voltage Vr(k) is applied to the terminal P1($k$). Here, the voltage Vr(k) is a variable voltage.

Next, in Step S205, the voltage Vr(k) is swept. For example, a voltage gradually swept from the ground potential to the high voltage side may be applied. For example, a voltage increased by $\Delta$Vr may be applied. At this time, for example, the voltage applied to the terminal P1($k$) is lower than the voltage Vm(k), and the high-potential signal is supplied to the gate of the transistor 162 from the comparator 173, whereby the transistor 162 is on.

Next, in Step S206, when the voltage Vr(k) is higher than or equal to the voltage Vm(k), the processing goes to Step S207. When the voltage Vr(k) is lower than the voltage Vm(k), the processing goes back to Step S205.

Next, in Step S207, a low-potential signal is output from the comparator 173. Thus, the low-potential signal is supplied to the gate of the transistor 162 included in the voltage comparison unit 111, whereby the transistor 162 is turned off. When the transistor 162 is off, the voltage Vm(k) can be retained in the inverting input terminal of the comparator 113. In the following Step S299, the processing ends.

As described above, with the use of the voltage generation circuit 119, the voltage Vm(k) can be retained in the inverting input terminal of the comparator 113 included in the voltage comparison unit 111.

Operation Example 2

Figure 4:
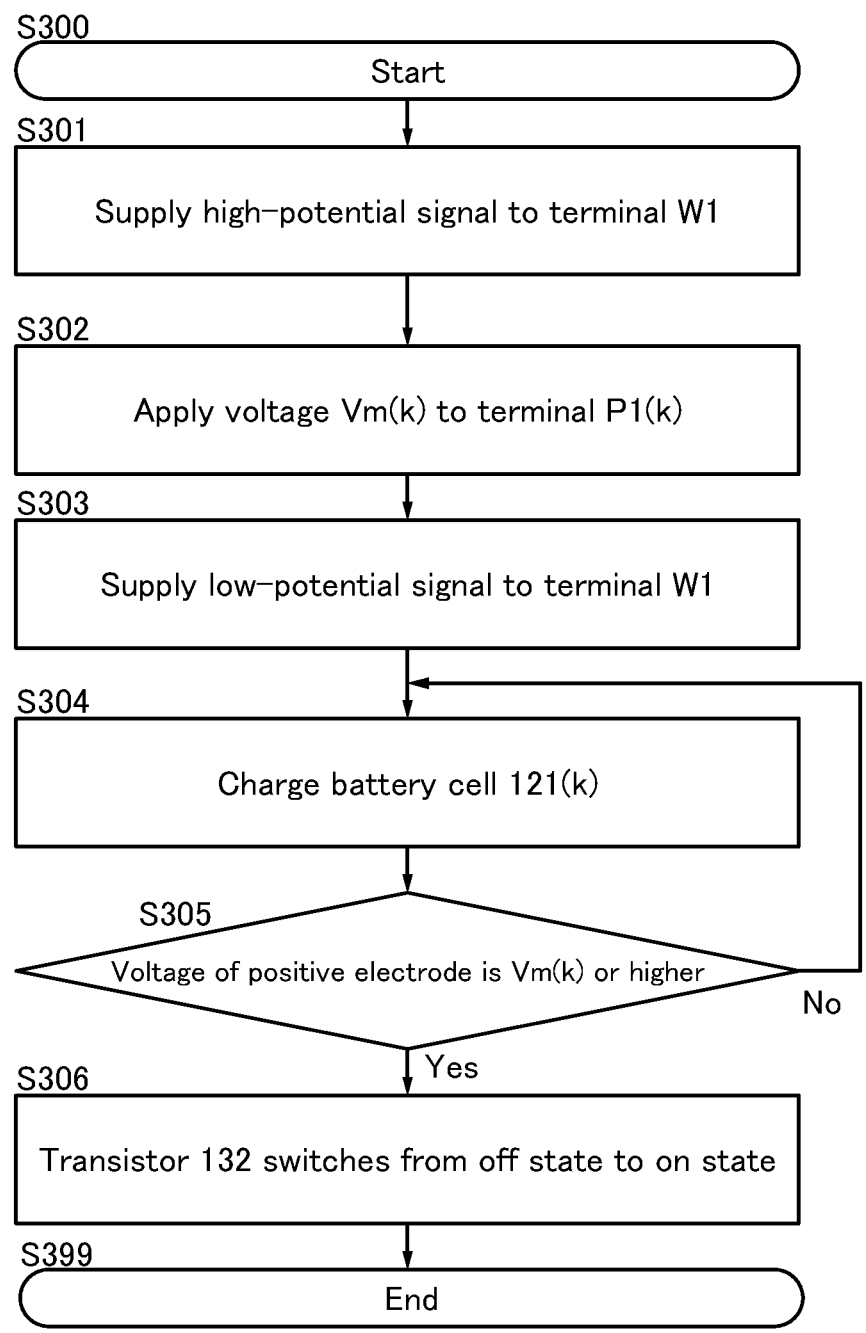
FIG. 4 is a flow chart showing one embodiment of the present invention.

An example of an operation method of the power storage device illustrated in FIG. 1 is described with reference to a flow chart shown in FIG. 4.

Processing starts in Step S300.

In Step S301, a high-potential signal is supplied to the terminal W1.

In Step S302, the voltage Vm(k) is supplied to the terminal P1($k$).

Next, in Step S303, a low-potential signal is supplied to the terminal W1. In this step, the voltage Vm(k) is retained in the inverting input terminal of the comparator 113.

Next, the battery cell 121($k$) is charged in Step S304.

Next, in Step S305, when the voltage of the positive electrode is higher than or equal to Vm(k), the processing goes to Step S306, and when the voltage of the positive electrode is lower than Vm(k), the processing goes back to Step S304.

Next, in Step S306, the transistor 132 is switched from an off state to an on state. In this step, charge of the secondary battery is stopped. Alternatively, a current for the secondary battery is limited.

The processing ends in Step S399.

Figure 5:
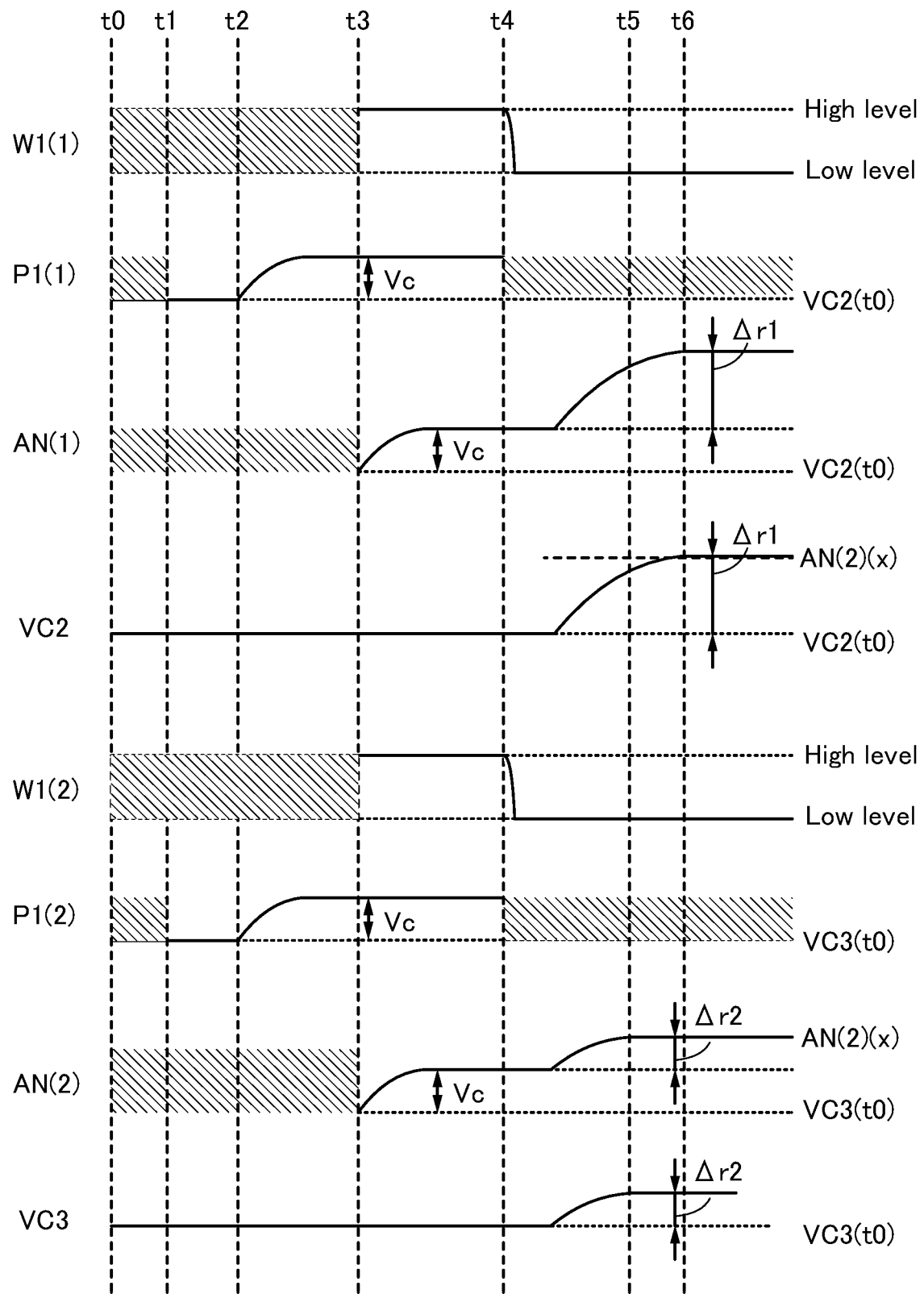
FIG. 5 is a timing chart illustrating operation of a power storage device of one embodiment of the present invention.

FIG. 5 is a timing chart showing an operation example of the power storage device illustrated in FIG. 1. FIG. 5 is a timing chart corresponding to a battery cell 121(1) and a battery cell 121(2).

In Time t0, the processing starts.

In Time t1, the voltage of the negative electrode of the battery cell 121($k$) is applied to the terminal P1($k$). In FIG. 5, a voltage VC2($t$0) is applied to the terminal P1(1) and a voltage VC3($t$0) is applied to the terminal P1(2).

In Time t2, the sum of the voltage of the negative electrode of the battery cell 121($k$) and the voltage Vc is applied to the terminal P1($k$). In FIG. 5, the sum of the voltage VC2($t$0) and the voltage Vc is applied to the terminal P1(1) and the sum of the voltage VC3($t$0) and the voltage Vc is applied to the terminal P1(2).

In Time t3, a high-potential signal (High level) is applied to a terminal W1($k$), and a potential is applied from the terminal P1($k$) to the node AN(k). In FIG. 5, high-potential signals are applied to a terminal W1(1) and a terminal W1(2), a potential is applied from the terminal P1(1) to the node AN(1), and a potential is applied from the terminal P1(2) to the node AN(2).

Although the negative electrode of the battery cell 121($k$) is shown constant between Time t1 to Time t3, actually, the potential is sometimes changed.

In Time t4, a low-potential signal (Low level) is supplied to the terminal W1($k$), the potential of the node AN(k) is retained, and a reference potential is programmed to the inverting input terminal of the comparator 113. Then, the potential of the node AN(k) varies in accordance with a change in the potential of the negative electrode. The comparator 113 compares the potential programmed to the inverting input terminal and a potential applied to the non-inverting input terminal. In the example shown in FIG. 5, the potentials of the node AN(2) and the terminal VC2 are compared.

For example, the potentials of the battery cells 121 are changed by charge or the like. In FIG. 5, in a period from Time t4 to Time t6, the potential of VC2, which is the potential of the negative electrode of the battery cell 121(1), is increased only by $\Delta$r1, and concurrently with that, the potential of the node AN(1) is also increased. In FIG. 5, in a period from Time t4 to Time t5, the potential of VC3, which is the potential of the negative electrode of the battery cell 121(2), is increased only by $\Delta$r2, and concurrently with that, the potential of the node AN(2) is also increased.

In Time t5 in FIG. 5, the potential of VC2 is lower than the potential of the node AN(2), and the comparator 113 in the cell-balance circuit 130(2), which compares the potentials of the node AN(2) and the terminal VC2, outputs a low-potential signal. When the potential of VC2 is higher than the potential of the node AN(2) in Time t6, the comparator 113 outputs a high-potential signal to turn on the transistor 132, whereby charge of the battery cell 121(2) is stopped.

Although the potential of the node AN(2) is shown constant between Time t5 to Time t6, actually, the potential is sometimes changed.

<Protection of Battery>

The battery control circuit 110 preferably has a function of a battery protection circuit.

The transistor 140 and the transistor 150 have a function of controlling charge or discharge of the assembled battery 120. For example, a conduction state or a non-conduction state of the transistor 140 is controlled by a control signal T1, so that whether the assembled battery 120 is charged or not is controlled. A conduction state or anon-conduction state of the transistor 150 is controlled by a control signal T2, so that whether the assembled battery 120 is discharged or not is controlled. In the example of the battery control circuit illustrated in FIG. 1, one of a source and a drain of the transistor 140 is electrically connected to a terminal VM. The terminal VM is electrically connected to a negative electrode of a charger, for example. The terminal VM is electrically connected to a load at the time of discharge, for example.

The transistor 140 and the transistor 150 are preferably electrically connected to the detection circuit 181. The detection circuit 181 preferably has a function of detecting overcharge and overdischarge of the assembled battery 120. The detection circuit 181 preferably has a function of detecting discharge overcurrent and charge overcurrent of the assembled battery 120.

The detection circuit 181 preferably has a function of detecting a short circuit of a group of circuits which are operated with the use of the assembled batteries 120. The detection circuit 181 is preferably electrically connected to the terminal VDDD and the terminal VSSS.

The detection circuit 181 may be electrically connected to the positive electrodes and the negative electrodes of the battery cells 121. In such a case, the detection circuit 181 can detect overcharge and overdischarge of each battery cell 121 in some cases.

The detection circuit 181 has functions of transmitting and receiving signals to/from the control circuit 170.

The battery control circuit 110 may have a function of observing a voltage value (a monitor voltage) of each of terminals of the battery cells 121 included in the assembled battery 120 and a current value (monitor current) flowing through the assembled battery. For example, the on-state current of the transistor 140 or the transistor 150 may be observed as the monitor current. Alternatively, a resistor may be provided in series with the transistor 140 or the like, and the current value of the resistor may be observed.

The battery control circuit 110 may have functions of measuring the temperature of the battery cell 121 and controlling charge and discharge of the battery cell in accordance with the measured temperature.

<Battery Cell>

A lithium-ion secondary battery cell can be used as the battery cell 121. The battery cell 121 is not limited to a lithium-ion secondary battery cell and as a positive electrode material of the secondary battery, a material including an element A, an element X, and oxygen can be used, for example. The element A is one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. Moreover, the element X is one or more selected from cobalt, nickel, manganese, iron, and vanadium. Typical examples include lithium-cobalt composite oxide ($LiCoO_2$) and lithium iron phosphate ($LiFePO_4$).

<Transistor>

In the structure of one embodiment of the present invention, with the use of a memory element including an OS transistor, a reference voltage can be retained in the memory element because a leakage current flowing between a source and a drain when the transistor is off (hereinafter referred to as an off-state current) is extremely low. In that case, power supply of the memory element can be off, thus, with the use of a memory element including an OS transistor, the reference voltage can be retained with extremely low power consumption.

The memory element including an OS transistor can retain an analog potential. For example, a voltage of the secondary battery can be retained in the memory element without being converted to a digital value with an analog-digital conversion circuit. Since the conversion circuit is unnecessary, the circuit area can be reduced.

In addition, the memory element using an OS transistor can rewrite and read the reference voltage by charging or discharging electric charge; thus, a substantially unlimited number of times of acquisition and reading of the monitor voltage is possible. Unlike a magnetic memory, a resistive random-access memory, or the like, the memory element using an OS transistor does not go through atomic-level structure change; thus, it is superior in rewrite endurance. In addition, in the memory element using an OS transistor, instability in characteristics due to an increase of electron trap centers, which is observed in a flash memory, is not observed even when rewrite operation is repeated.

An OS transistor has features of an extremely low off-state current and favorable switching characteristics even in a high-temperature environment. Accordingly, charge or discharge of the assembled battery 120 can be controlled without a malfunction even in a high-temperature environment.

A memory element using an OS transistor can freely be placed by being stacked over a circuit using an Si transistor or the like, so that integration can be easy. Furthermore, OS transistors can be manufactured with a manufacturing apparatus similar to that for Si transistors and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain depending on a voltage applied to the gate electrode or the back gate electrode. Therefore, it is possible to design circuits under the same thought as LSI. Furthermore, electrical characteristics of the OS transistor are better than those of a Si transistor in a high-temperature environment. Specifically, the ratio between an on-state current and an off-state current is large even at a high temperature higher than or equal to 100° C. and lower than or equal to 200° C., preferably higher than or equal to 125° C. and lower than or equal to 150° C.; thus, favorable switching operation can be performed.

OS transistors are preferably used as the transistor 162 and the transistor 172. An OS transistor may be used as the transistor 132. OS transistors may be used as the transistor 140 and the transistor 150.

The comparator can be formed with a Si transistor. Alternatively, the comparator may be formed with an OS transistor.

Example 2 of Power Storage Device

Figure 6:
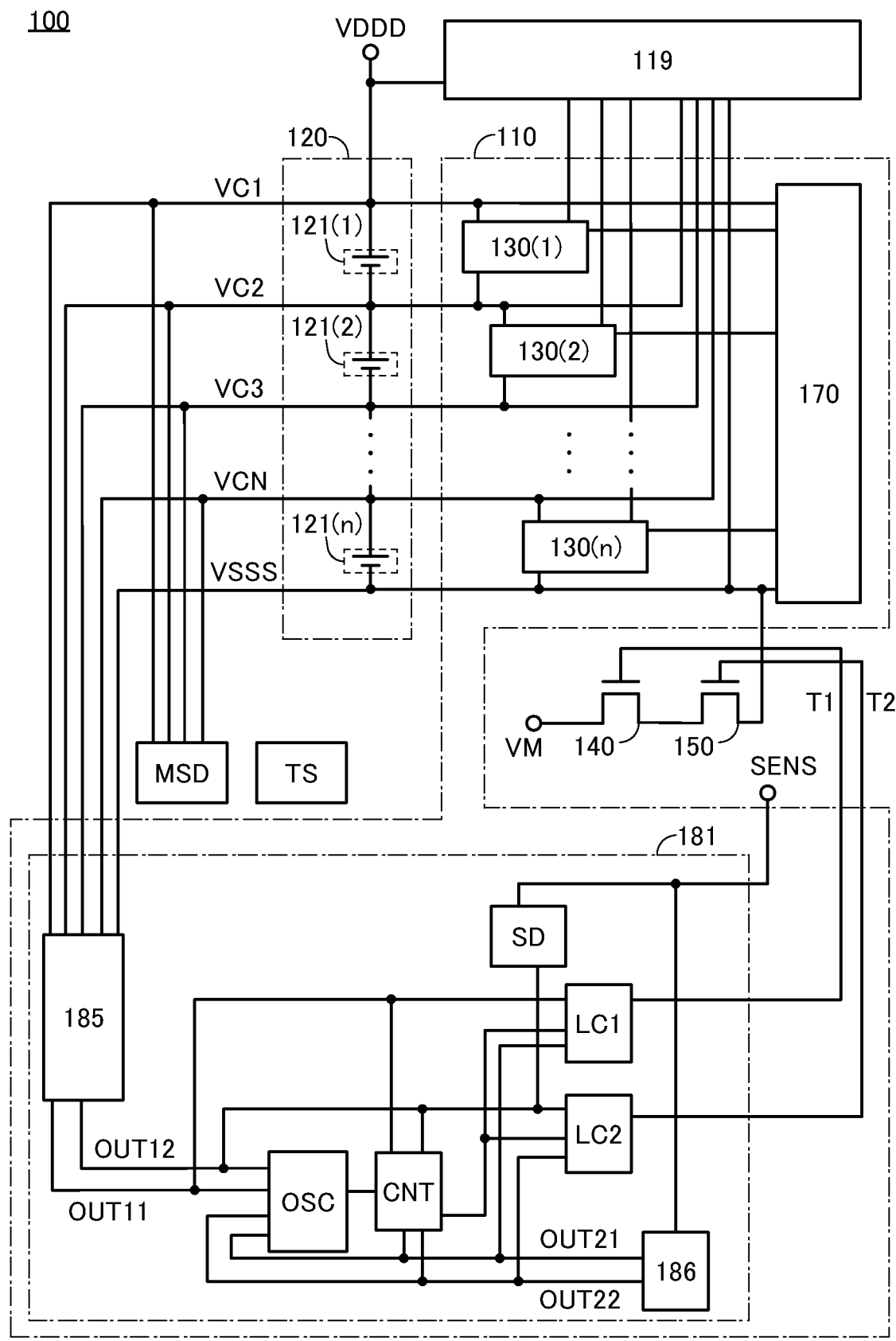
FIG. 6 is a block diagram illustrating one embodiment of the present invention.

FIG. 6 illustrates an example of the power storage device 100 of one embodiment of the present invention which includes a detection circuit 185, a detection circuit 186, an oscillator circuit OSC, a counter CNT, a logic circuit LCT, a logic circuit LC2, and a short-circuit detection circuit SD in addition to the components illustrated in FIG. 1. Note that these circuits are preferably included in the detection circuit 181 as illustrated in FIG. 6. At least some of the oscillator circuit OSC, the counter CNT, the logic circuit LCT, and the logic circuit LC2 may be included in the control circuit 170.

The power storage device 100 illustrated in FIG. 6 further includes a temperature sensor TS and a micro short-circuit detection circuit MSD. These circuits may be included in the detection circuit 181.

Figure 7:
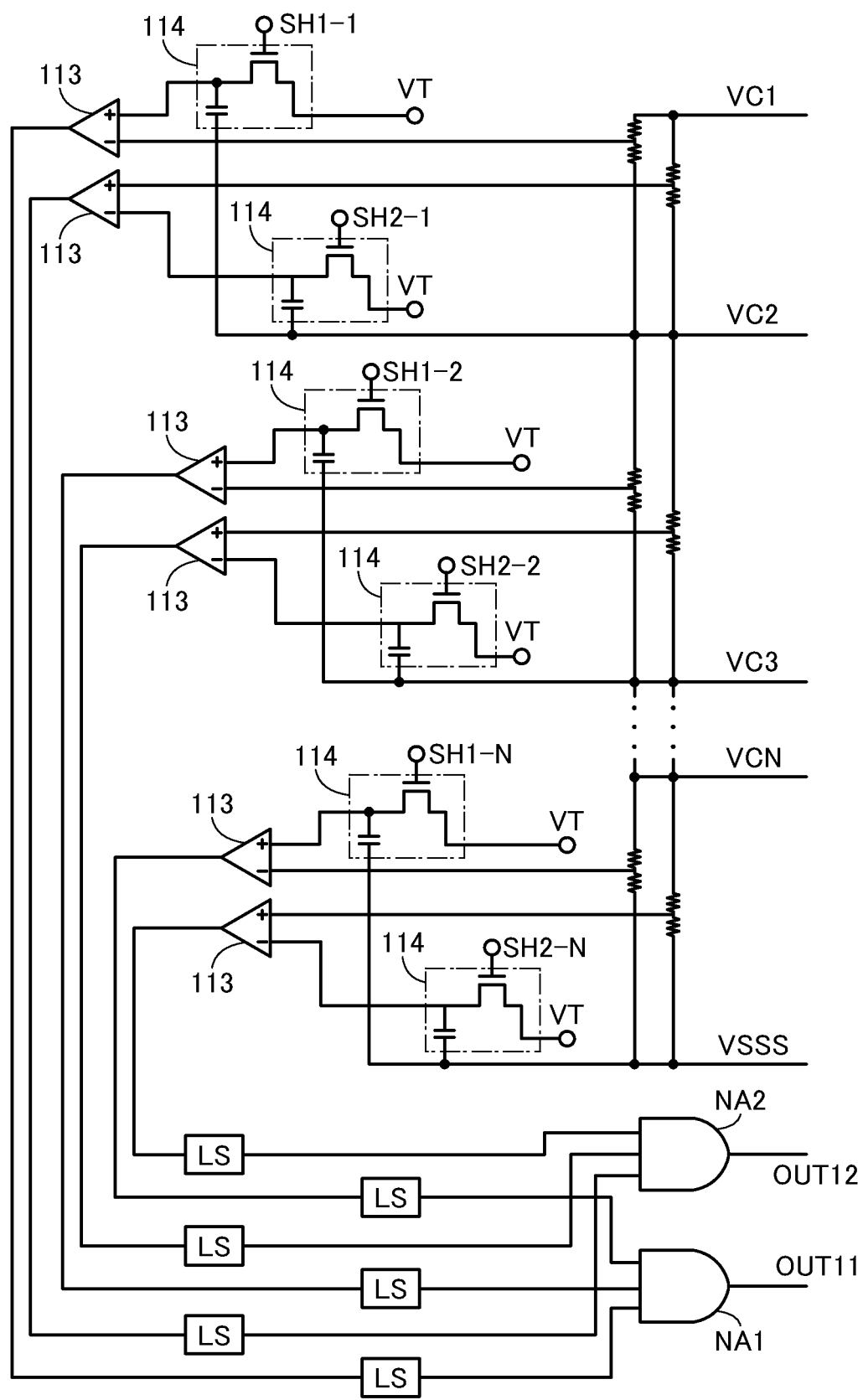
FIG. 7 is a circuit diagram illustrating one embodiment of the present invention.

The detection circuit 185 has a function of detecting overcharge and overdischarge of the assembled battery 120. The detection circuit 186 has a function of detecting discharge overcurrent and charge overcurrent of the assembled battery 120. The details of the detection circuit 185 are illustrated in FIG. 7, and the details of the detection circuit 186 are illustrated in FIG. 8.

The short-circuit detection circuit SD has a function of detecting short circuit of a group of circuits which are operated with the use of the assembled batteries 120. The detection circuit SD is electrically connected to a terminal SENS. The terminal SENS detects a charge current and a discharge current of the assembled battery 120, for example.

A signal is supplied from an output terminal OUT11 and an output terminal OUT12 of the detection circuit 185 to the oscillator circuit OSC. Furthermore, signals are supplied from the output terminal OUT11 to the logic circuit LCT and from the output terminal OUT12 to the logic circuit LC2.

A signal is supplied from an output terminal OUT21 and an output terminal OUT22 of the detection circuit 186 to the oscillator circuit OSC. Furthermore, signals are supplied from the output terminal OUT21 to the logic circuit LCT and from the output terminal OUT22 to the logic circuit LC2.

The oscillator circuit OSC outputs a clock signal that oscillates at a predetermined frequency. The output terminal OUT11 and the output terminal OUT12 of the detection circuit 185 and the output terminal OUT21 and the output terminal OUT22 of the detection circuit 186 input signals to the oscillator circuit OSC, and the operation of the oscillator circuit OSC is controlled by these signals.

The counter CNT has a function of counting in synchronization with a clock signal output from the oscillator circuit OSC for a certain period. Signals counted by the counter CNT are input to the logic circuits LC1 and LC2.

The logic circuit LC1 and the logic circuit LC2 control the assembled battery 120 in accordance with the signals counted by the counter CNT. For example, control signals are supplied to the transistor 140 and the transistor 150, whereby the charge and discharge of the assembled battery 120 is controlled. The logic circuit LC1 and the logic circuit LC2 can shift voltage levels to control the transistor 140 and the transistor 150.

As described with reference to FIG. 1, as an operation example of the transistor 140, a conduction state or a non-conduction state is controlled by the control signal T1, so that whether the assembled battery 120 is charged or not is controlled. As an operation example of the transistor 150, a conduction state or a non-conduction state is controlled by the control signal T2, so that whether the assembled battery 120 is discharged or not is controlled.

As in the example illustrated in FIG. 6, a configuration in which the transistor 140 and the transistor 150 are not included in the battery control circuit 110 and are provided on a chip or the like outside the battery control circuit 110 may be employed.

In FIG. 6, one of a source and a drain of the transistor 150 is electrically connected to the terminal VSSS, and the other is electrically connected to the one of the source and the drain of the transistor 140. The other of the source and the drain of the transistor 140 is electrically connected to the terminal VM. The terminal VM is electrically connected to a negative electrode of a charger, for example. The terminal VM is electrically connected to a load at the time of discharge, for example.

FIG. 7 illustrates an example of a circuit diagram of the detection circuit 185. The detection circuit 185 illustrated in FIG. 7 is electrically connected to terminals at both ends (for example, the terminal VC1, the terminal VC2, the terminal VC3, the terminal VCN, the terminal VSSS, and the like) of each of the plurality of battery cells 121 included in the assembled battery 120.

In the detection circuit 185, a voltage between the terminal VC1 and the terminal VC2 is resistance-divided. The resistance-divided voltage is applied to an inverting input terminal of a first comparator (the comparator 113), and a first memory element (the memory element 114) is electrically connected to a non-inverting input terminal thereof. A signal SH1-1 is supplied to a gate of a transistor included in the first memory element. The resistance-divided voltage is applied to a non-inverting input terminal of a second comparator (another comparator 113), and a second memory element (another memory element 114) is electrically connected to an inverting input terminal thereof. A signal SH2-1 is supplied to a gate of a transistor included in the second memory element. Note that the resistance-divided voltage may be generated by the voltage generation circuit 119.

The first memory element retains a voltage applied from the terminal VT. The retained voltage is a voltage corresponding to overcharge detection. When a voltage input to the inverting input terminal becomes higher than the voltage corresponding to overcharge detection, output from the first comparator is inverted. The output from the first comparator is supplied to an AND circuit NA1 through a level shifter LS.

The second memory element retains a voltage applied from the terminal VT. The retained voltage is a voltage corresponding to overdischarge detection. When a voltage input to the non-inverting input terminal becomes lower than the voltage corresponding to overdischarge detection, output from the second comparator is inverted. The output from the second comparator is supplied to an AND circuit NA2 through a level shifter LS.

The memory element including an OS transistor can retain a voltage stably for a long time. Accordingly, power supply of a circuit supplying a signal to the terminal VT can be stopped or part of operation of the circuit can be stopped, leading to a reduction in power consumption.

Similarly, two comparators that monitor a voltage between the terminal VC2 and the terminal VC3 are provided, and a signal SH1-2 and a signal SH2-2 are supplied as control signals. In addition, two comparators that monitor a voltage between the terminal VCN and the terminal VSSS are provided, and a signal SH1-N and a signal SH2-N are supplied as control signals.

Here, a voltage applied to each of the terminals VT electrically connected to the plurality of memory elements 114 included in the detection circuit 185 is preferably generated by the voltage generation circuit 119. Different voltages can be applied to the terminals VT.

Note that the comparator included in the detection circuit 185 may be what is called a hysteresis comparator whose threshold is different between when the output is changed from the L level to the H level and when the output is changed from the H level to the L level.

Here, the structure of the detection circuit 185 may be used not only for detection of overcharge, overdischarge, and the like but also for control of a charge voltage, for example. More specifically, for example, at the time of charge, in the case where the charge voltage of the secondary battery is controlled to be within a certain voltage range including a desired charge voltage, the structure of the detection circuit 185 may be used for controlling the upper limit and the lower limit of the voltage range.

Figure 8A:
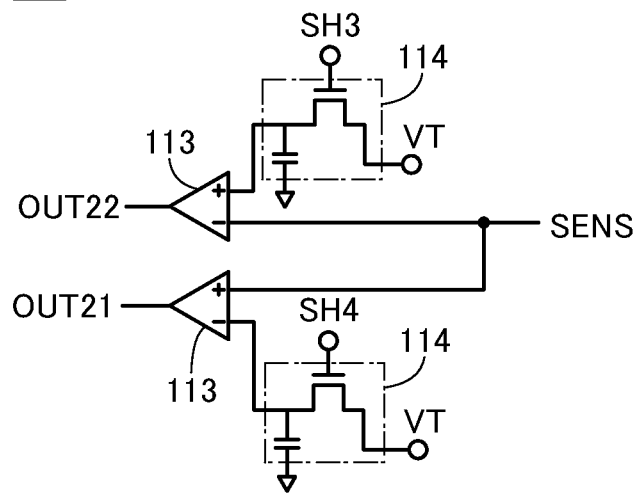
FIG. 8A is a circuit diagram illustrating one embodiment of the present invention.

FIG. 8A illustrates an example of a circuit diagram of the detection circuit 186. The detection circuit 186 includes two comparators 113.

A signal SH3 is supplied to a non-inverting input terminal of one of the comparators 113, and the memory element 114 which retains a voltage corresponding to discharge overcurrent detection is electrically connected to the non-inverting input terminal of one of the comparators 113. The terminal SENS is electrically connected to the inverting input terminal. When an overcurrent is detected from the voltage applied to the inverting input terminal, output from the output terminal OUT22 is inverted.

The terminal SENS is electrically connected to a non-inverting input terminal of the other of the comparators 113. A signal SH4 is supplied to an inverting input terminal of the other of the comparators 113, and the memory element 114 corresponding to charge overcurrent is electrically connected to the inverting input terminal of the other of the comparators 113. When an overcurrent is detected from the voltage applied to the non-inverting input terminal, output from the output terminal OUT21 is inverted.

Figure 8B:
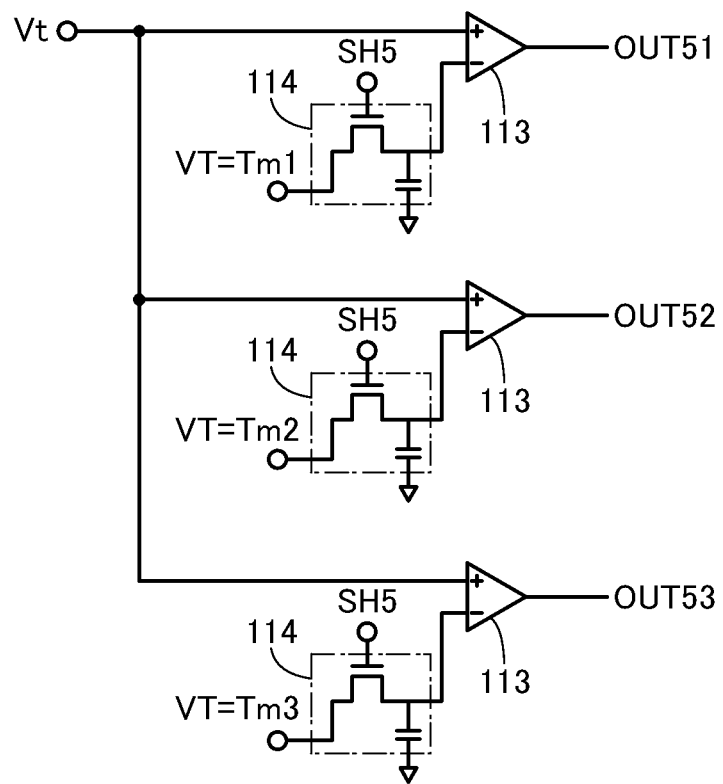
FIG. 8B is a circuit diagram illustrating one embodiment of the present invention.

The temperature sensor TS has a function of measuring the temperature of the assembled battery 120 or the power storage device 100 including the assembled battery 120. FIG. 8B is a circuit diagram illustrating an example of the temperature sensor TS. Note that the circuit diagram in FIG. 8B illustrates some circuits of the temperature sensor TS in some cases.

The temperature sensor TS in FIG. 8B includes three comparators 113, and voltages VT (VT=Tm1, Tm2, Tm3) which correspond to different temperatures are applied to inverting input terminals of the comparators. Each of the applied voltages VT is retained in the memory element 114 which is electrically connected to the inverting input terminal. The voltages Tm1, Tm2, and Tm3 may be applied from, for example, the voltage generation circuit 119. To output terminals OUT51, OUT52, and OUT53, the respective comparators 113 are electrically connected. The memory elements 114 are electrically connected to inverting input terminals of the comparators 113. A terminal that is electrically connected to a gate of the transistor 162 included in each of the memory elements 114 is referred to as SH5. As the voltages VT, Tm1, Tm2, and Tm3 are applied to SH5 of the transistors 162 included in the memory elements 114 which are electrically connected to the output terminals OUT51, OUT52, and OUT53.

A voltage corresponding to the measured temperature is applied to an input terminal Vt. The input terminal Vt is supplied to the non-inverting input terminal of each of the three comparators 113.

In accordance with the results of comparison of the voltage applied to the input terminal Vt with the voltage of the inverting input terminal of each of the comparators 113, a signal is output from the output terminal (the output terminal OUT51, the output terminal OUT52, or the output terminal OUT53) of the comparator, whereby the temperature can be determined.

An OS transistor has a feature in that the resistance value becomes lower when the temperature rises. By utilizing this feature, the ambient temperature can be converted into a voltage. This voltage may be applied to the input terminal Vt, for example. That is, for example, a voltage based on the resistance value of the OS transistor can be applied to the input terminal Vt. Alternatively, for example, a voltage based on the resistance value of the OS transistor is applied to the input terminal Vt through a conversion circuit or the like.

The logic circuit LC1 and the logic circuit LC2 may be configured to detect output from the temperature sensor TS, and turn off the transistor 140 and (or) the transistor 150 to stop charge and (or) discharge when the temperature exceeds the temperature range in which the assembled battery 120 can operate.

Figure 9A:
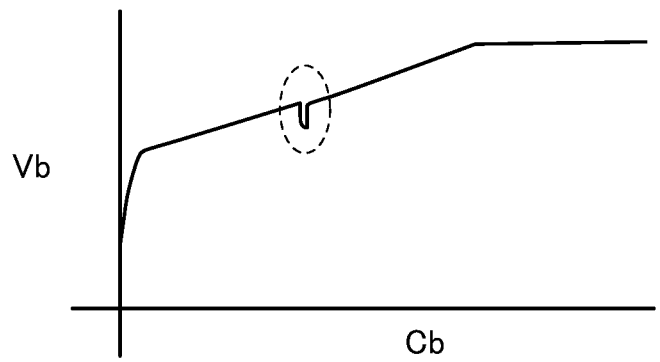
FIG. 9A shows a charge and discharge curve.

The detection circuit MSD has a function of detecting a micro-short circuit of the assembled battery 120. For example, by monitoring either a voltage or a current or the both, the micro-short circuit can be detected. FIG. 9A shows an example of a waveform of charge which indicates a micro-short circuit. In FIG. 9A, the horizontal axis represents charge capacity Cb of the secondary battery, and the vertical axis represents a voltage Vb of the secondary battery. A region or the like surrounded by a dotted line indicates a micro-short circuit.

A micro-short circuit refers to a minute short circuit in a secondary battery, and is not a short circuit of a positive electrode and a negative electrode of a secondary battery which makes charge and discharge impossible but a phenomenon in which a small amount of short-circuit current flows through a minute short circuit portion for a short period. A micro-short circuit is presumably caused in the following manner: a plurality of charge and discharge operations generate deterioration, a metal element such as lithium or cobalt is precipitated in the battery, the growth of the precipitate generates the local concentration of current in part of a positive electrode and part of a negative electrode, and the function of a separator partially stops or a by-product is generated.

Figure 9B:
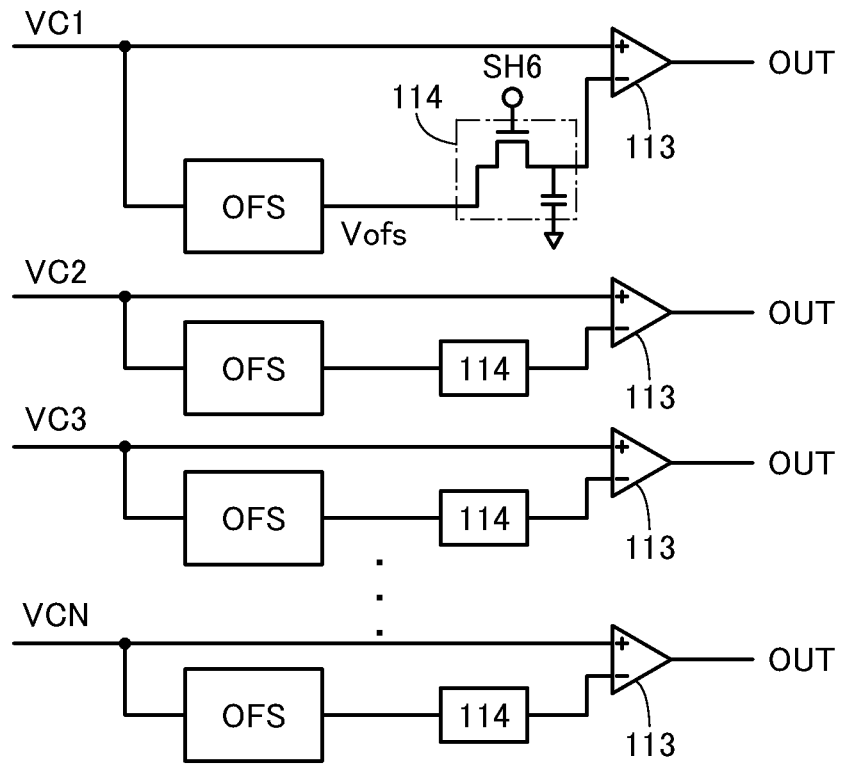
FIG. 9B is a circuit diagram illustrating one embodiment of the present invention.

FIG. 9B is a circuit diagram illustrating an example of the detection circuit MSD. Note that the circuit diagram in FIG. 9B shows some circuits of the detection circuit MSD in some cases. The detection circuit MSD is supplied with voltages from the terminal VC1, the terminal VC2, the terminal VC3, and the terminal VCN.

The detection circuit MSD includes the comparators 113 which correspond to the respective battery cells 121. The memory element 114 is connected to the inverting input terminal of the comparator 113. A signal SH6 is supplied to the memory element 114.

The non-inverting input terminal of the comparator 113 is supplied with the voltage of the battery cell 121 (e.g., the voltage of the positive electrode); and the inverting input terminal is supplied with a voltage Vofs, which is obtained by offsetting the voltage by an offset circuit OFS, in the case where the signal SH6 is a high potential, and the supplied voltage is retained in the case where the signal SH6 is a low potential. For example, the Vofs can be slightly lower than the voltage.

Figure 9C:
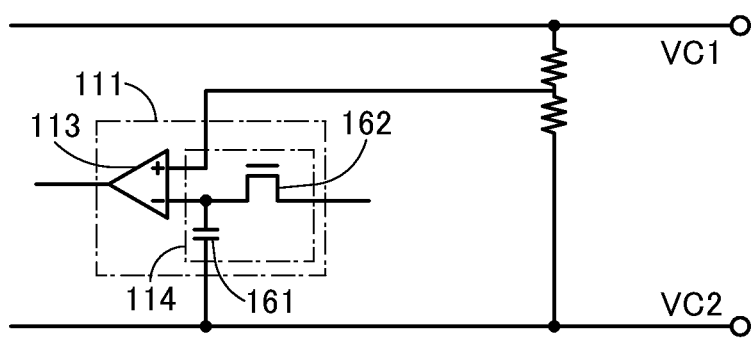
FIG. 9C is a circuit diagram illustrating one embodiment of the present invention.

As an example illustrated in FIG. 9C, in the comparator included in the circuit illustrated in FIG. 1 or the circuit illustrated in FIG. 9B, resistance division between the terminal VC1 and the terminal VC2 may be performed to generate a voltage lower than that of the terminal VC1 and the voltage may be applied to the non-inverting input terminal of the comparator 113.

Figure 10A:
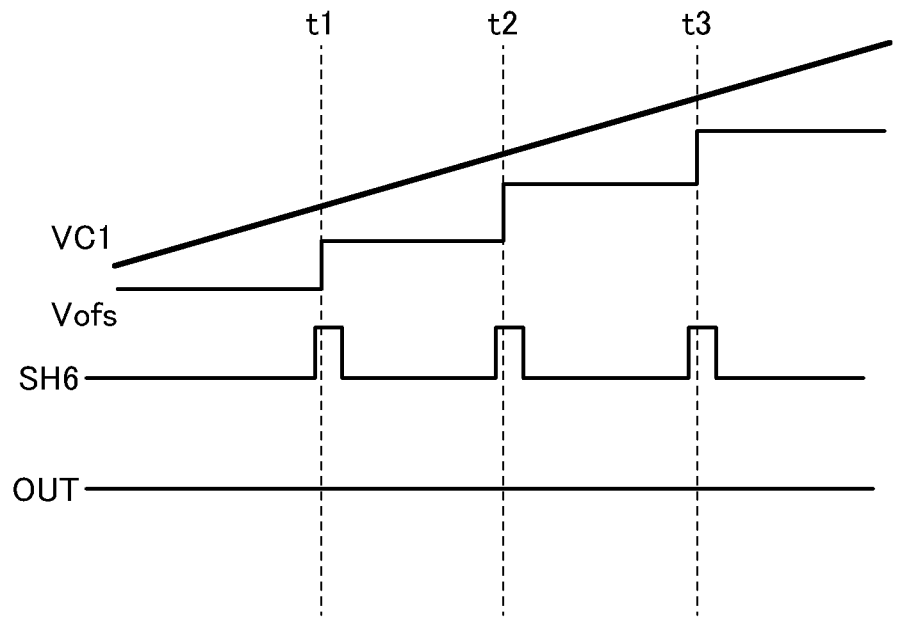
FIG. 10A is a timing chart illustrating operation of a power storage device of one embodiment of the present invention.
Figure 10B:
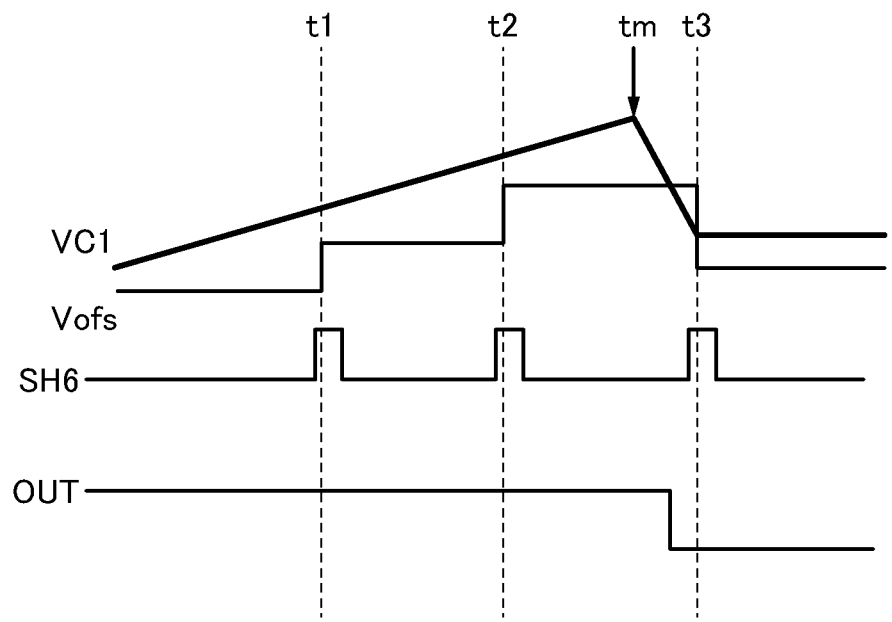
FIG. 10B is a timing chart illustrating operation of a power storage device of one embodiment of the present invention.

FIG. 10A shows an example of a timing chart in normal operation at the time of charge of the battery cell 121, and FIG. 10B shows an example of a timing chart where a micro-short circuit is detected.

In FIG. 10A, the voltage of the battery cell 121, here, the voltage of the terminal VC1 as an example, increases with time. When the signal SH6 is a high potential, the voltage Vofs is a voltage obtained by offsetting the voltage of the terminal VC1, and when the signal SH6 is a low potential, the applied voltage is retained. Thus, as shown in FIG. 10A, the voltage Vofs increases from Time t1 to t2, and t3 in a stepwise manner. In FIG. 10A, the voltage of the terminal VC1 is constantly higher than the voltage ofs, and thus the output from the comparator 113 remains a high potential.

In FIG. 10B, the voltage of the terminal VC1 rapidly decreases at Time tm, and a micro-short circuit occurs. When the voltage of the terminal VC1 is lower than the voltage Vofs, the output from the comparator 113 is a low potential, and a micro-short circuit is detected.

In the blocks included in the power storage device of one embodiment of the present invention, for example, in the cell-balance circuit 130, the detection circuit 185, the detection circuit 186, the temperature sensor TS, and the like, an analog potential can be retained by the memory element including an OS transistor. That is, for example, in a period during which the power storage device performs protection of the secondary battery or monitoring, when the analog potential is supplied once, it is not necessary to supply the analog potential again (hereinafter expressed as rewrite) or it is possible to make the rewriting frequency extremely low. In the case where the analog potential is not retained, in order to supply the analog potential frequently, for example, conversion circuits corresponding to the blocks or potentials are used. In such a case, the circuit area is increased. In contrast, in the case where the analog potential is retained, for example, the rewriting frequency is extremely low; thus, the analog potentials may be sequentially output from one conversion circuit and the analog potentials may be retained. In other words, a conversion circuit can be used in common with respect to the blocks or the potentials.

Figure 22:
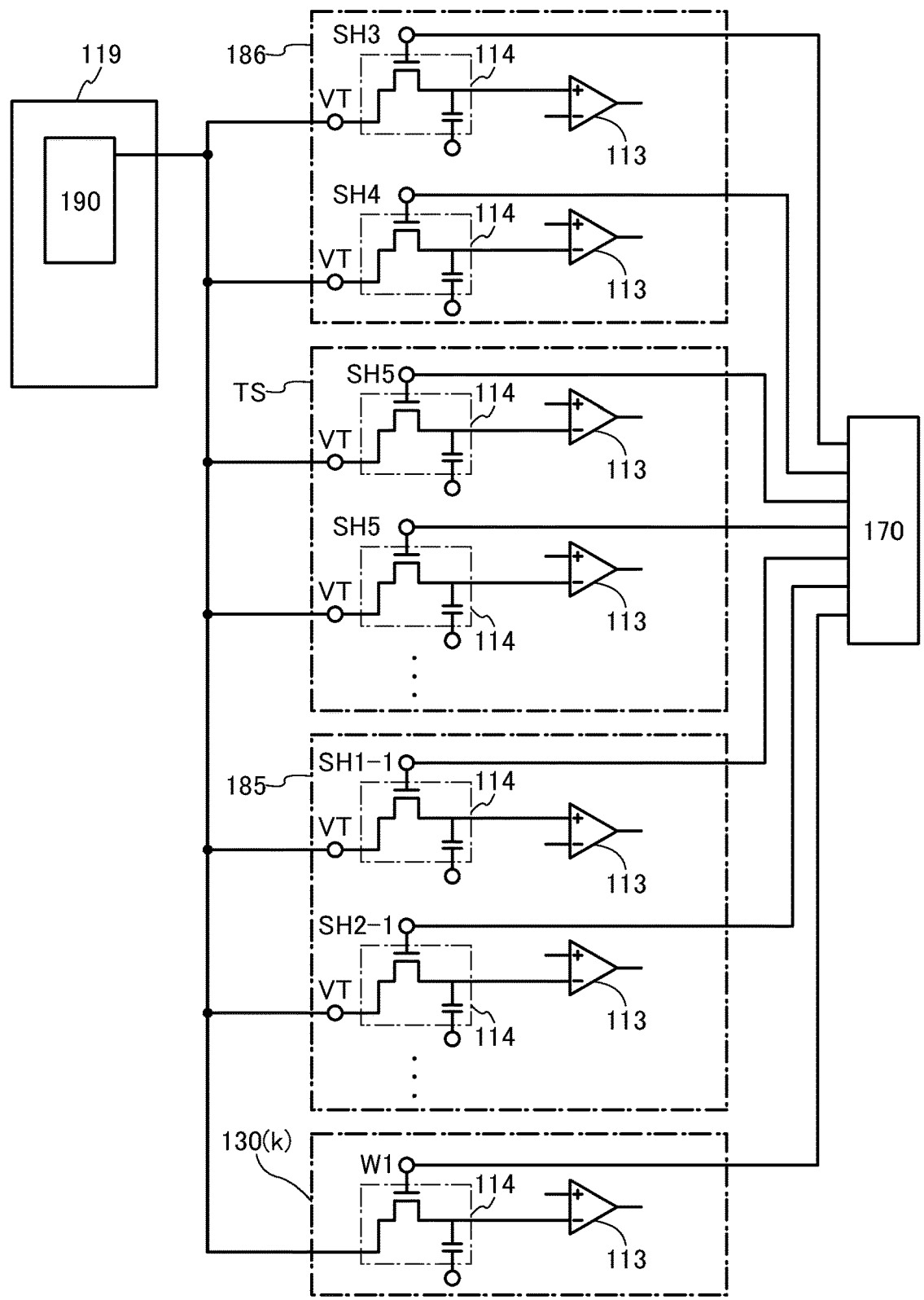
FIG. 22 is a circuit diagram illustrating one embodiment of the present invention.

FIG. 22 illustrates an example of electrical connection between the digital-analog conversion circuit 190 included in the voltage generation circuit 119 and the cell-balance circuit 130($k$), the detection circuit 185, the detection circuit 186, and the temperature sensor TS. Analog potentials output from the digital-analog conversion circuit 190 are supplied to the memory elements 114 included in the blocks and retained.

Since the supplied analog potentials are retained, power gating is possible in the digital-analog conversion circuit 190 in a period during which analog potentials are not supplied to the memory elements 114 included in the blocks; thus, power consumption is reduced.

<Circuit Evaluation Results>

Figure 23:
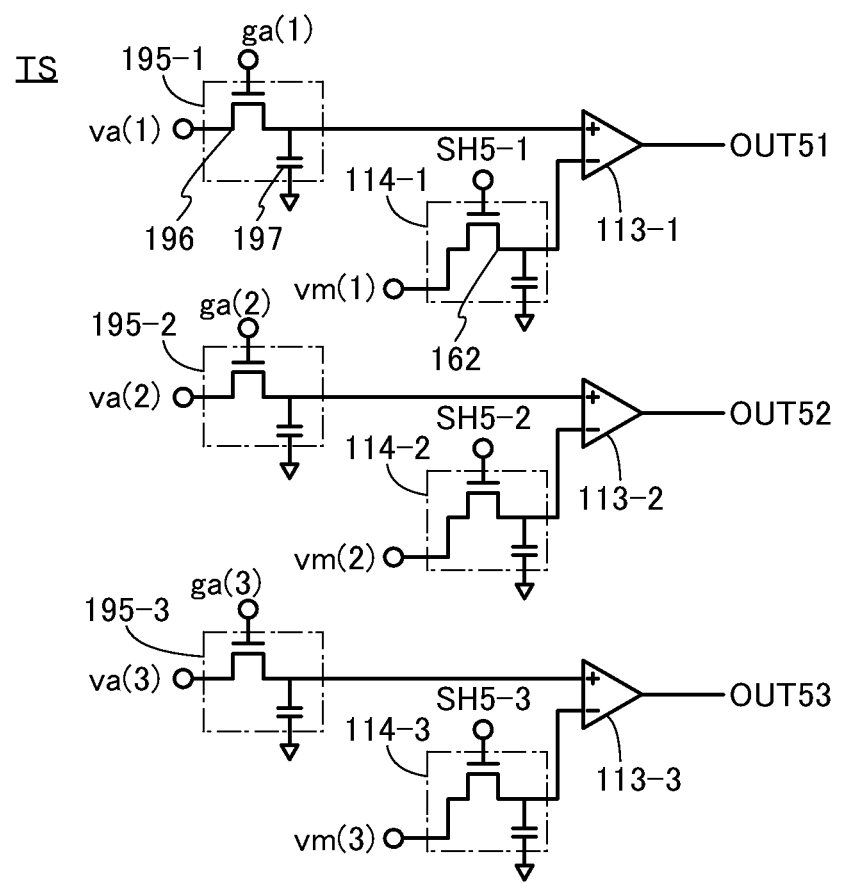
FIG. 23 is a circuit diagram illustrating one embodiment of the present invention.

The temperature sensor TS included in the power storage device of one embodiment of the present invention is evaluated. FIG. 23 illustrates a configuration of the temperature sensor TS used for the evaluation.

In FIG. 23, the comparators 113 electrically connected to the output terminals OUT51, OUT52, and OUT53 are referred to as comparators 113-1, 113-2, and 113-3, respectively. The memory elements 114 electrically connected to inverting output terminals of the comparators 113-1, 113-2, and 113-3 are referred to as memory elements 114-1, 114-2, and 114-3, respectively.

Terminals electrically connected to the gates of the transistors 162 included in the memory elements 114-1, 114-2, and 114-3 are referred to as SH5-1, SH5-2, and SH5-3, respectively, and terminals that supply potentials to the transistors 162 are referred to as vm(1), vm(2), and vm(3), respectively.

As the transistors 162 included in the memory elements 114-1, 114-2, and 114-3, OS transistors are used. Here, the transistors 162 are n-channel transistors.

In the temperature sensor TS illustrated in FIG. 23, a sensor circuit 195 including an OS transistor 196 and a capacitor 197 is used as a sensor circuit. One of a source and a drain of the OS transistor 196 is electrically connected to a non-inverting output terminal of the comparator 113 and one electrode of the capacitor 197, and a terminal va is electrically connected to the other of the source and the drain of the OS transistor 196. A terminal ga is electrically connected to a gate of the OS transistor 196. The sensor circuits 195 electrically connected to non-inverting output terminals of the comparators 113-1, 113-2, and 113-3 are referred to as sensor circuits 195-1, 195-2, and 195-3, respectively. The terminals va electrically connected to the sensor circuits 195-1, 195-2, and 195-3 are referred to as terminals va(1), va(2), and va(3), respectively. The terminals ga electrically connected to the sensor circuits 195-1, 195-2, and 195-3 are referred to as terminals ga(1), ga(2), and ga(3), respectively.

The OS transistor can be used as a temperature sensor element by utilizing the threshold of the OS transistor that changes depending on temperature. That is, the OS transistor 196 has a function of a temperature sensor element. Here, the OS transistor 196 is an n-channel transistor.

Here, it is preferable that transistors with the same structure be used as the transistor 162 and the OS transistor 196. For example, the channel length, the channel width, the gate capacitance, and the like are preferably the same.

Signals for 30° C., 40° C., and 50° C. are supplied to the temperature sensor TS. First, in an environment at 30° C., a high-potential signal is supplied to the terminal SH5-1, and low-potential signals are supplied to the terminal SH5-2, the terminal SH5-3, the terminal ga(1), the terminal ga(2), and the terminal ga(3). A voltage (here, referred to as a voltage vx) which causes threshold drop is applied to the terminal vm(1), whereby a voltage (vx−vth1) corresponding to the threshold at 30° C. is stored in an inverting input terminal of the comparator 113-1. Here, vth1 is the threshold of the transistor 162 at 30° C.

Here, an example of the voltage which causes threshold drop is, for example, the case where when the source voltage is 0 V, a value obtained by subtracting the voltage (here, the drain voltage) from the gate voltage is smaller than the threshold.

Next, a low-potential signal is supplied to the terminal SH5-1.

Next, a high-potential signal is supplied to the terminal SH5-2 and the voltage vx is similarly applied to the terminal vm(2) in an environment at 40° C., whereby a voltage (vx−vth2) is stored in an inverting input terminal of the comparator 113-2. Here, vth2 is the threshold of the transistor 162 at 40° C.

Next, a low-potential signal is supplied to the terminal SH5-2.

Next, a high-potential signal is supplied to the terminal SH5-3 and the voltage vx is similarly applied to the terminal vm(3) in an environment at 50° C., whereby a voltage (vx−vth3) is stored in an inverting input terminal of the comparator 113-3. Here, vth3 is the threshold of the transistor 162 at 50° C.

In the above manner, values corresponding to the temperatures are stored in the inverting input terminals of the comparators 113.

Next, the ambient temperature of the temperature sensor TS is changed from 25° C. to 60° C., and voltages of the output terminal OUT51, the output terminal OUT52, and the output terminal OUT53 are measured.

The voltage vx is applied to the terminals va included in the sensor circuits 195. Although it is possible to constantly supply a high-potential signal to the terminal ga, intermittent supply of the high-potential signal can reduce the power consumption. The OS transistor can retain the applied voltage even when the terminal ga is supplied with a low-potential signal because its leakage current is extremely low. In this evaluation, a high-potential signal is supplied in a period of shorter than or equal to 100 μs at intervals of 100 ms.

Figure 24:
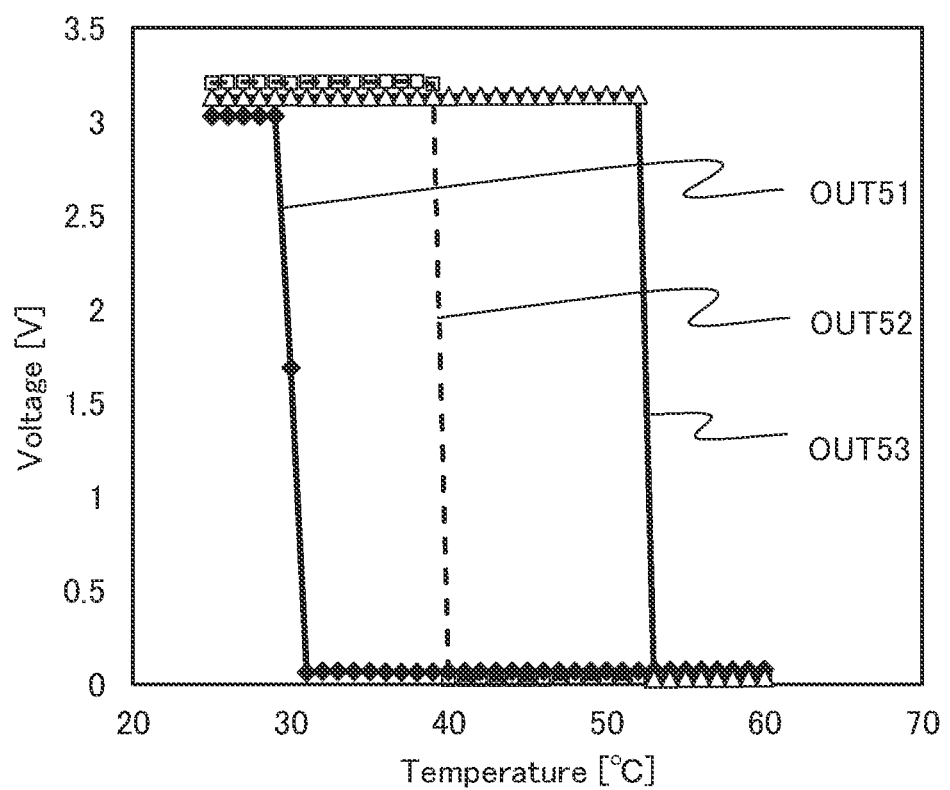
FIG. 24 shows the evaluation results of a temperature sensor.

FIG. 24 shows the evaluation results. The horizontal axis represents the ambient temperature, and the vertical axis represents voltages of the output terminal OUT51, the output terminal OUT52, and the output terminal OUT53. It is found that low-potential signals are output from the comparators at certain temperatures.

Note that operations for writing data to the memory element 114-1, the memory element 114-2, and the memory element 114-3 at 30° C., 40° C., and 50° C., respectively, are described in the above; however, data corresponding to the threshold at the respective temperatures can be written regardless of the temperatures at the time of data writing.

This embodiment can be combined with any of the other embodiments as appropriate.

Embodiment 2

A structure example of a semiconductor device applicable to the battery control circuit described in the above embodiment will be described.

Figure 11:
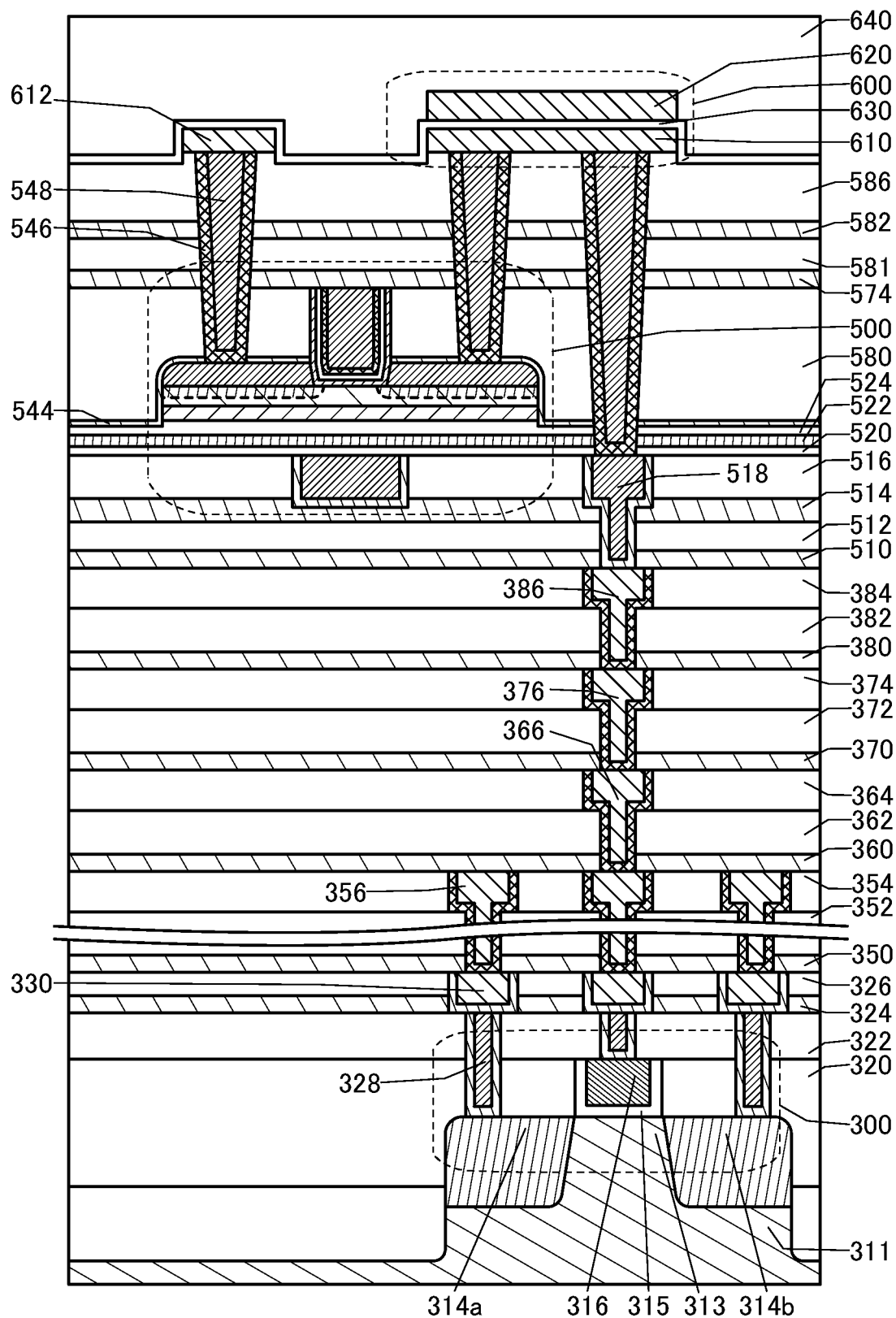
FIG. 11 is a cross-sectional diagram illustrating a structure example of a semiconductor device.
Figure 13A:
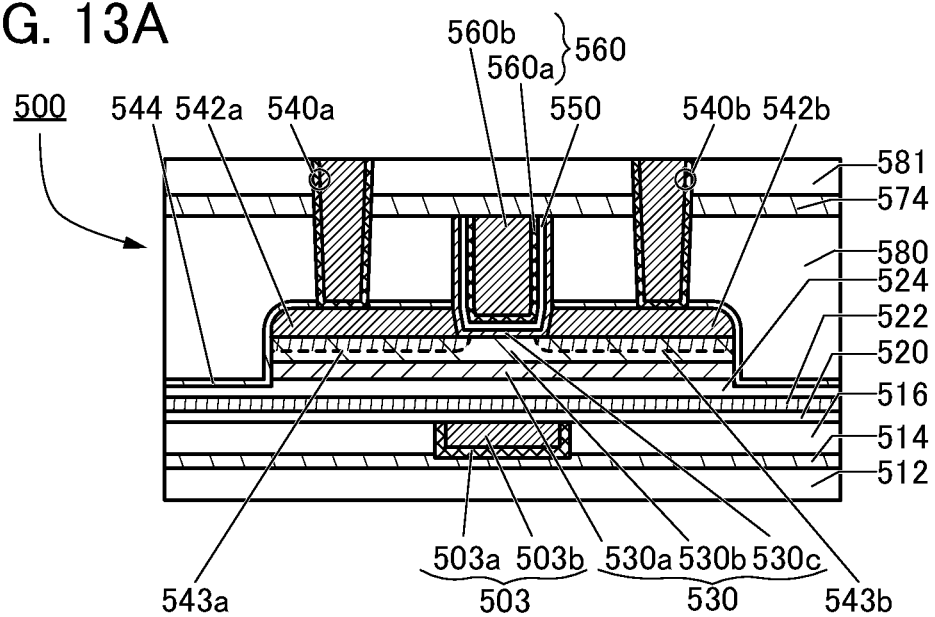
FIG. 13A is a cross-sectional diagram illustrating a structure example of a transistor.
Figure 13B:
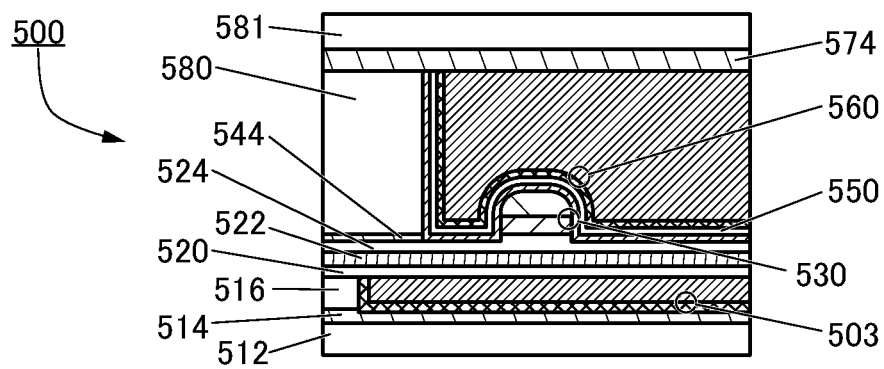
FIG. 13B is a cross-sectional diagram illustrating a structure example of a transistor.
Figure 13C:
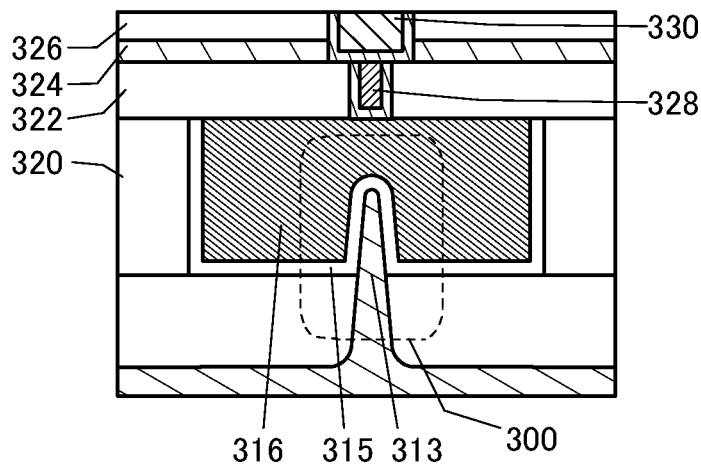
FIG. 13C is a cross-sectional diagram illustrating a structure example of a transistor.

A semiconductor device illustrated in FIG. 11 includes a transistor 300, a transistor 500, and a capacitor 600. FIG. 13A is a cross-sectional diagram of the transistor 500 in the channel length direction, FIG. 13B is a cross-sectional diagram of the transistor 500 in the channel width direction, and FIG. 13C is a cross-sectional diagram of the transistor 300 in the channel width direction.

The transistor 500 is an OS transistor. Since the off-state current of the transistor 500 is low, when the transistor 500 is used as an OS transistor included in the semiconductor device, written data can be retained for a long time.

The transistor 500 is an n-channel transistor, for example.

Here, the battery control circuit described in the above embodiment may be formed with OS transistors. For example, part of the battery control circuit described in the above embodiment is preferably formed with OS transistors. For example, the transistor 162 and the transistor 172 included in the battery control circuit may be OS transistors. For example, the comparator included in the battery control circuit can be formed with an OS transistor. The comparator included in the battery control circuit may be formed with unipolar transistors, for example, only n-channel transistors.

The semiconductor device described in this embodiment includes the transistor 300, the transistor 500, and the capacitor 600, as shown in FIG. 11. The transistor 500 is provided above the transistor 300, and the capacitor 600 is provided above the transistor 300 and the transistor 500.

The transistor 300 is provided over a substrate 311 and includes a conductor 316, an insulator 315, a semiconductor region 313 that is part of the substrate 311, and a low-resistance region 314*a* and a low-resistance region 314*b* each functioning as a source region or a drain region. Note that the transistor 300 can be used as the transistor included in the comparator in the above embodiment, for example.

As shown in FIG. 13C, in the transistor 300, atop surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon.

Alternatively, the regions may be formed using a material containing Ge (germanium), SiGe (silicon germanium), GaAs (gallium arsenide), GaAlAs (gallium aluminum arsenide), or the like.

A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 12:
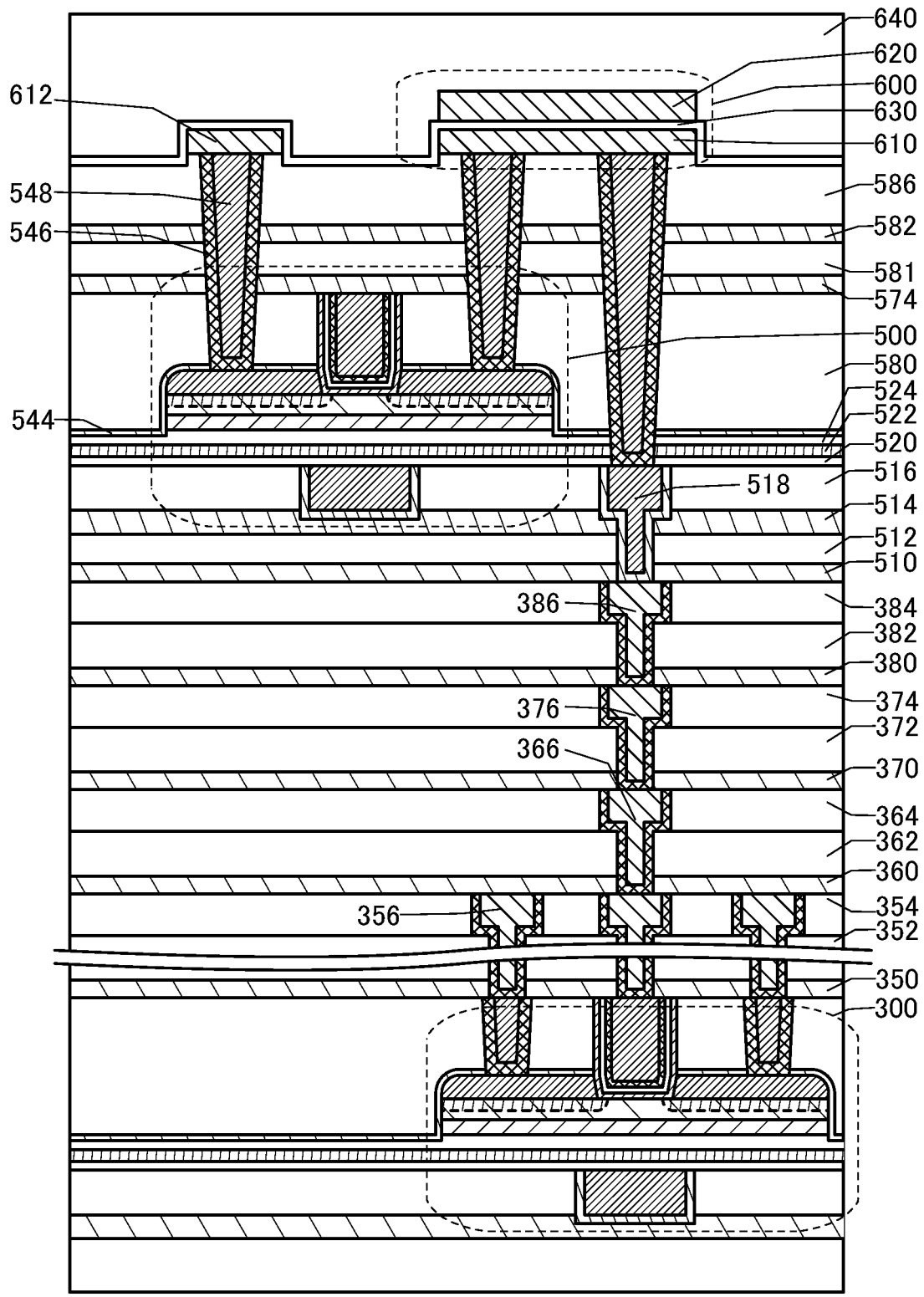
FIG. 12 is a cross-sectional diagram illustrating a structure example of a semiconductor device.

Note that the transistor 300 shown in FIG. 11 is an example and the structure is not limited thereto; an appropriate transistor is used in accordance with a circuit configuration or a driving method. For example, when the semiconductor device is composed of only OS transistors, the transistor 300 has a structure similar to that of the transistor 500 using an oxide semiconductor, as shown in FIG. 12. Note that the details of the transistor 500 are described later.

An insulator 320, an insulator 322, an insulator 324, and an insulator 326 are stacked sequentially and provided to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 11, an insulator 350, an insulator 352, and an insulator 354 are stacked sequentially and provided. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 11, an insulator 360, an insulator 362, and an insulator 364 are stacked sequentially and provided. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 11, an insulator 370, an insulator 372, and an insulator 374 are stacked sequentially and provided. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 11, an insulator 380, an insulator 382, and an insulator 384 are stacked sequentially and provided. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

As shown in FIGS. 13A and 13B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an oxide 530c positioned on a bottom and a side surface of the opening; an insulator 550 positioned on a formation surface of the oxide 530c; and a conductor 560 positioned on a formation surface of the insulator 550.

In addition, as shown in FIGS. 13A and 13B, an insulator 544 is preferably positioned between the insulator 580 and the oxide 530a, the oxide 530b, the conductor 542a, and the conductor 542b. Furthermore, as shown in FIGS. 13A and 13B, the conductor 560 preferably includes a conductor 560a provided inside the insulator 550 and a conductor 560b provided to be embedded inside the conductor 560a. Moreover, as shown in FIGS. 13A and 13B, an insulator 574 is preferably positioned over the insulator 580, the conductor 560, and the insulator 550.

Note that in the following description, the oxide 530a, the oxide 530b, and the oxide 530c are sometime collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 shown in FIG. 11, FIG. 13A, or the like is an example and the structure is not limited thereto; an appropriate transistor is used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 505 is not necessarily provided. Note that the conductor 503b is shown as a single layer but may have a stacked-layer structure, for example, a stack of the above conductive material and titanium or titanium nitride.

The insulator 520, the insulator 522, the insulator 524, and the insulator 550 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{21}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIGS. 13A and 13B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide which can be used as the oxide 530 is preferably a CAAC (c-axis-aligned crystalline)-OS (oxide semiconductor) or a CAC (cloud-aligned composite)-OS. A CAAC-OS has c-axis alignment and a distorted crystal structure; in a CAAC-OS, nanocrystals are connected in the a-b plane direction. Furthermore, as the oxide 530, an In—Ga oxide or an In—Zn oxide may be used.

The metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 13A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 13A or the like, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (atop surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is shown in FIGS. 13A and 13B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low dielectric constant is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in FIG. 11, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a change in electrical characteristics can be inhibited and reliability can be improved in a semiconductor device using a transistor including an oxide semiconductor. Alternatively, a battery control circuit using a transistor including an oxide semiconductor can be miniaturized or highly integrated.

This embodiment can be combined with any of the other embodiments as appropriate.

Embodiment 3

In this embodiment, an example in which the battery control circuit described in the above embodiment is used as an electronic component will be described using FIG. 14A and FIG. 14B.

Figure 14A:
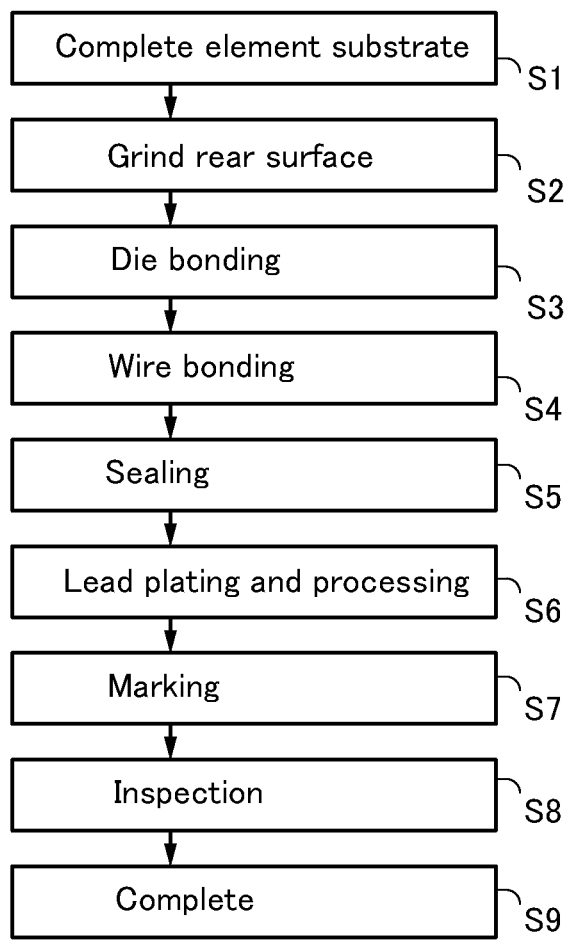
FIG. 14A is a flow chart showing a process of manufacturing an electronic component.

FIG. 14A shows an example in which the battery management circuit described in the above embodiment is used as an electronic component. Note that the electronic component is also referred to as a semiconductor package or an IC package. For the electronic component, there are a plurality of standards and names corresponding to a terminal extraction direction and a terminal shape. Thus, examples thereof are described in this embodiment.

A circuit portion including an OS transistor or a Si transistor is completed by integrating a plurality of detachable components on a printed circuit board through an assembly process (a post-process).

The post-process can be completed through steps shown in FIG. 14A. Specifically, after an element substrate obtained in a pre-process is completed (Step S1), a rear surface of the substrate is ground (Step S2). The substrate is thinned down at this stage, so that warpage or the like of the substrate in the pre-process is reduced and the size of the component is reduced.

The rear surface of the substrate is ground, and a dicing step is performed to divide the substrate into a plurality of chips. Then, a die bonding step of individually picking up the divided chips to be mounted on and bonded to a lead frame is performed (Step S3). To bond the chip and the lead frame in this die bonding step, a method such as bonding with resin or bonding with a tape is selected as appropriate depending on products. Note that in the die bonding step, chips may be mounted on and bonded to an interposer.

Next, wire bonding in which a lead of the lead frame and an electrode on the chip are electrically connected with a metal fine line (wire) is performed (Step S4). A silver line or a gold line can be used as the metal fine line. Furthermore, ball bonding or wedge bonding can be used as the wire bonding.

The wire-bonded chip is subjected to sealing with an epoxy resin or the like in a molding step (Step S5). With the molding step, the inside of the electronic component is filled with resin, so that damage to the circuit portion and the wire embedded by external mechanical force can be reduced, and degradation in characteristics due to moisture or dust can be reduced.

Next, the lead of the lead frame is subjected to plating treatment. Then, the lead is cut and processed (Step S6). This plating treatment prevents corrosion of the lead and enables more reliable soldering at the time of mounting the electronic component on a printed circuit board in a later step.

Next, printing treatment (marking) is performed on a surface of the package (Step S7). Then, through a final inspection step (Step S8), an electronic component that includes a circuit portion including a PLD is completed (Step S9).

Figure 14B:
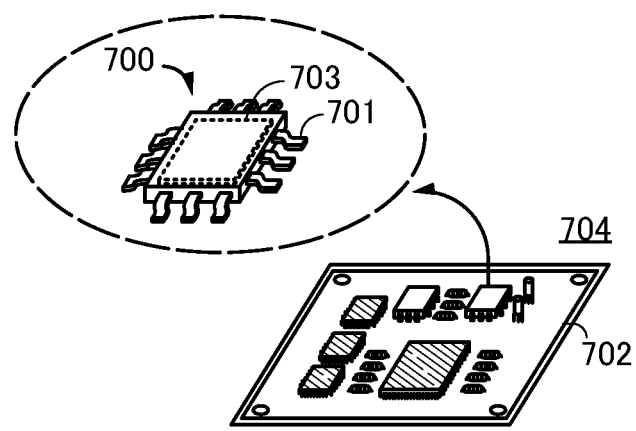
FIG. 14B is a schematic perspective diagram of the electronic component.

Furthermore, FIG. 14B shows a perspective schematic view of the completed electronic component. FIG. 14B shows a perspective schematic view of a QFP (Quad Flat Package) as an example of the electronic component. A lead 701 and a circuit portion 703 of an electronic component 700 are shown in FIG. 14B. The electronic component 700 shown in FIG. 14B is mounted on a printed circuit board 702, for example. A plurality of electronic components 700 that are combined and electrically connected to each other over the printed circuit board 702 can be mounted inside an electronic device. A completed circuit board 704 is provided in an electronic device or the like.

Embodiment 4

In this embodiment, structures of a power storage device and a power storage system to which an electronic component including the battery control circuit described in the above embodiment can be applied will be described.

[Cylindrical Secondary Battery]

Figure 15A:
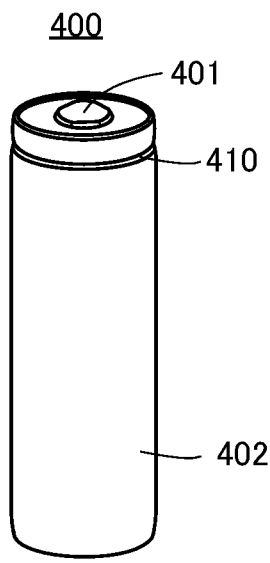
FIG. 15A is a diagram illustrating an example of a secondary battery.

An example of a cylindrical secondary battery is described with reference to FIG. 15A. A cylindrical secondary battery 400 includes, as illustrated in FIG. 15A, a positive electrode cap (battery lid) 401 on the top surface and a battery can (outer can) 402 on the side and bottom surfaces. The positive electrode cap 401 and the battery can (outer can) 402 are insulated from each other by a gasket (insulating packing) 410.

Figure 15B:
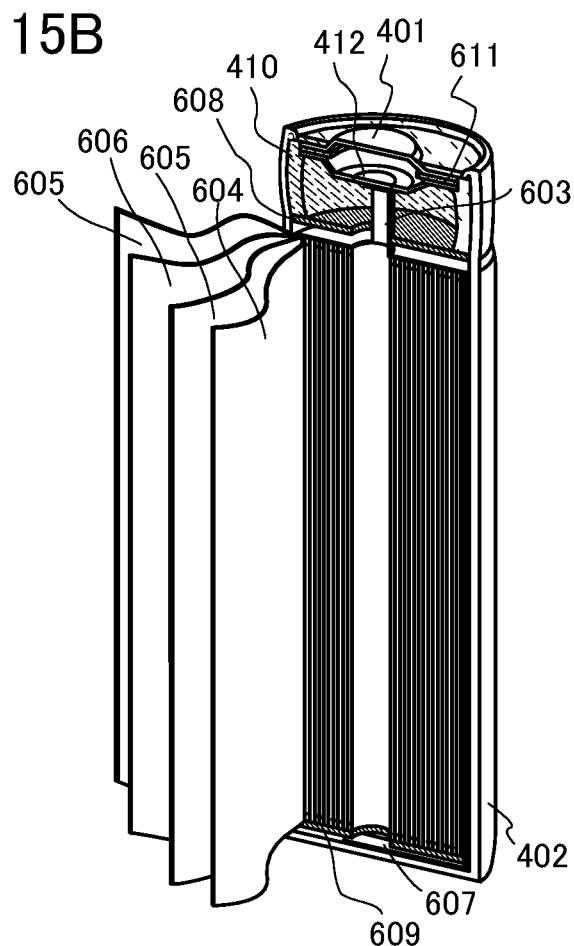
FIG. 15B is a diagram illustrating an example of a secondary battery.

FIG. 15B is a schematic cross-sectional diagram of the cylindrical secondary battery 400. As illustrated in FIG. 15B, the cylindrical secondary battery 400 includes a positive electrode cap (battery lid) 401 on a top surface and a battery can (outer can) 402 on a side surface and a bottom surface. The positive electrode cap and the battery can (outer can) 402 are insulated from each other by a gasket (insulating packing) 410.

Inside the battery can 402 having a hollow cylindrical shape, a battery element in which a belt-like positive electrode 604 and a belt-like negative electrode 606 are wound with a separator 605 located therebetween is provided. Although not shown, the battery element is wound centering around a center pin. One end of the battery can 402 is closed and the other end thereof is open. For the battery can 402, a metal having a corrosion-resistant property to an electrolyte solution, such as nickel, aluminum, or titanium, an alloy of such a metal, or an alloy of such a metal and another metal (e.g., stainless steel) can be used. Alternatively, the battery can 402 is preferably covered with nickel, aluminum, or the like in order to prevent corrosion due to the electrolyte solution. Inside the battery can 402, the battery element in which the positive electrode, the negative electrode, and the separator are wound is sandwiched between a pair of insulating plates 608 and 609 that face each other. Furthermore, a nonaqueous electrolyte (not illustrated) is injected inside the battery can 402 provided with the battery element. As the nonaqueous electrolyte, a nonaqueous electrolyte that is similar to that for the coin-type secondary battery can be used.

Since a positive electrode and a negative electrode that are used for a cylindrical storage battery are wound, active materials are preferably formed on both surfaces of a current collector. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 412 and the bottom of the battery can 402, respectively. The safety valve mechanism 412 is electrically connected to the positive electrode cap 401 through a PTC (positive temperature coefficient) element 611. The safety valve mechanism 412 cuts off electrical connection between the positive electrode cap 401 and the positive electrode 604 when the internal pressure of the battery exceeds a predetermined threshold. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 15C:
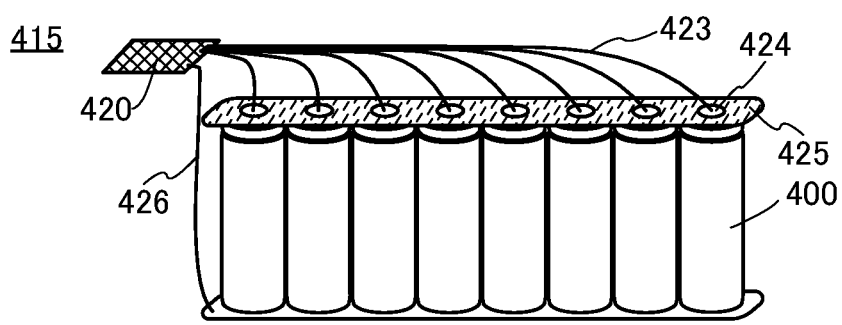
FIG. 15C is a diagram illustrating a structure example of a plurality of secondary batteries.

FIG. 15C illustrates an example of a power storage system 415. The power storage system 415 includes a plurality of secondary batteries 400. Positive electrodes of the secondary batteries are in contact with conductors 424 isolated by an insulator 425 and are electrically connected. The conductor 424 is electrically connected to a control circuit 420 through a wiring 423. Negative electrodes of the secondary batteries are electrically connected to the control circuit 420 through a wiring 426. As the control circuit 420, the battery control circuit described in the above embodiment can be used.

Figure 15D:
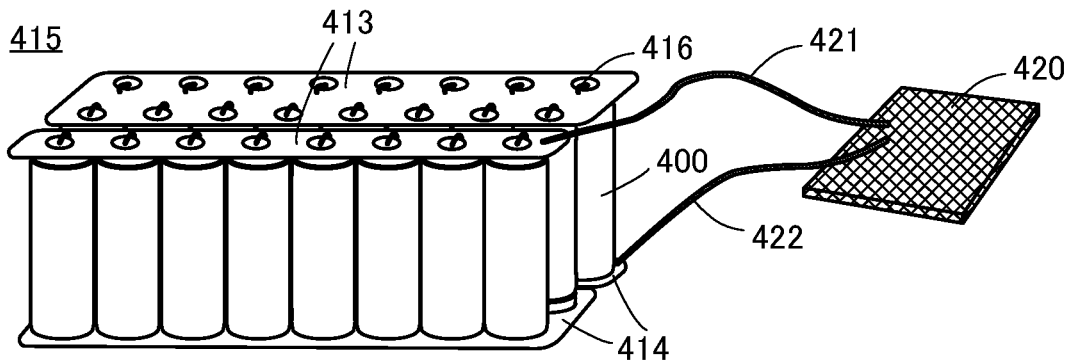
FIG. 15D is a diagram illustrating a structure example of a plurality of secondary batteries.

FIG. 15D illustrates an example of the power storage system 415. The power storage system 415 includes the plurality of secondary batteries 400, and the plurality of secondary batteries 400 are sandwiched between a conductive plate 413 and a conductive plate 414. The plurality of secondary batteries 400 are electrically connected to the conductive plate 413 and the conductive plate 414 through the wiring 416. The plurality of secondary batteries 400 may be connected parallel to each other, connected in series, or connected in series after being connected parallel to each other. With the power storage system 415 including the plurality of secondary batteries 400, large electric power can be extracted.

The case where the plurality of secondary batteries 400 are connected in parallel and then further connected in series is considered. In such a case, in the power storage device illustrated in FIG. 1 or FIG. 2, for example, the battery cell 121 corresponds to the plurality of secondary batteries connected in parallel, and one cell-balance circuit 130 is electrically connected to the plurality of secondary batteries connected in parallel.

A temperature control device may be provided between the plurality of secondary batteries 400. When the secondary batteries 400 are heated excessively, the temperature control device can cool them, and when the secondary batteries 400 are cooled too much, the temperature control device can heat them. Thus, the performance of the power storage system 415 is not easily influenced by the outside air temperature.

In FIG. 15D, the power storage system 415 is electrically connected to the control circuit 420 through a wiring 421 and a wiring 422. As the control circuit 420, the battery control circuit described in the above embodiment can be used. The wiring 421 is electrically connected to the positive electrodes of the plurality of the secondary batteries 400 through the conductive plate 413. The wiring 422 is electrically connected to the negative electrodes of the plurality of the secondary batteries 400 through the conductive plate 414.

[Secondary Battery Pack]

Next, examples of the power storage system of one embodiment of the present invention are described with reference to FIG. 16A, FIG. 16B, and FIG. 16C.

Figure 16A:
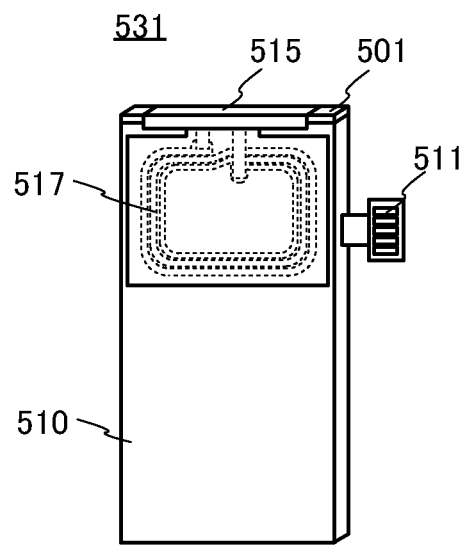
FIG. 16A is a diagram illustrating an example of a battery pack.
Figure 16B:
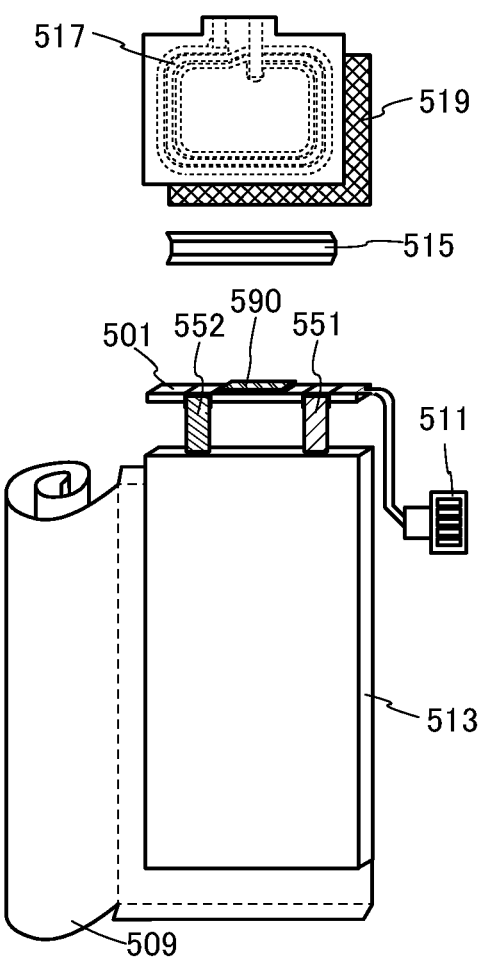
FIG. 16B is a diagram illustrating an example of a battery pack.

FIG. 16A is an external view of a secondary battery pack 531. FIG. 16B illustrates a structure of the secondary battery pack 531. The secondary battery pack 531 includes a circuit board 501 and a secondary battery 513. A label 509 is attached onto the secondary battery 513. The circuit board 501 is fixed by a sealant 515. The secondary battery pack 531 also includes an antenna 517.

The circuit board 501 includes a control circuit 590. As the control circuit 590, the battery control circuit described in the above embodiment can be used. For example, as illustrated in FIG. 16B, the control circuit 590 is provided over the circuit board 501. The circuit board 501 is electrically connected to a terminal 511. The circuit board 501 is electrically connected to the antenna 517, one 551 of a positive electrode lead and a negative electrode lead of the secondary battery 513, and the other 552 of the positive electrode lead and the negative electrode lead.

Figure 16C:
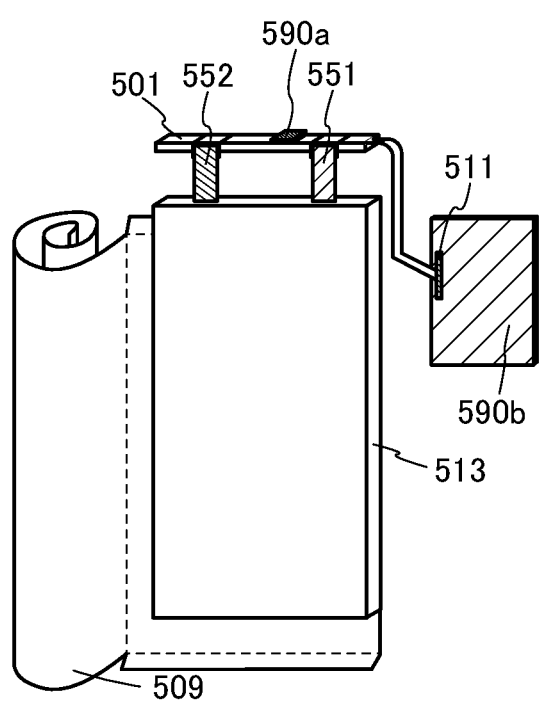
FIG. 16C is a diagram illustrating an example of a battery pack.

Alternatively, as illustrated in FIG. 16C, a circuit system 590a provided over the circuit board 501 and a circuit system 590b electrically connected to the circuit board 501 through the terminal 511 may be included. For example, a part of the control circuit of one embodiment of the present invention is provided in the circuit system 590a, and another part of the control circuit of one embodiment of the present invention is provided in the circuit system 590b.

The shape of the antenna 517 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, the antenna 517 may be a flat-plate conductor. This flat-plate conductor can serve as one of conductors for electric field coupling. That is, the antenna 517 can serve as one of two conductors of a capacitor. Thus, electric power can be transmitted and received not only by an electromagnetic field or a magnetic field but also by an electric field.

The secondary battery pack 531 includes a layer 519 between the antenna 517 and the secondary battery 513. The layer 519 has a function of blocking an electromagnetic field from the secondary battery 513, for example. As the layer 519, for example, a magnetic body can be used.

The secondary battery 513 may include a wound battery element. The wound battery element is obtained through winding a sheet of a stack in which the negative electrode overlaps with the positive electrode with the separator interposed therebetween.

This embodiment can be combined with any of the other embodiments as appropriate.

Embodiment 5

In this embodiment, an example of a vehicle equipped with a power storage system which is one embodiment of the present invention is described. Examples of vehicles are automobiles, motorcycles, bicycles, and the like.

The use of power storage systems in vehicles enables production of next-generation clean energy vehicles such as hybrid electric vehicles (HEVs), electric vehicles (EVs), and plug-in hybrid electric vehicles (PHEVs).

Figure 17A:
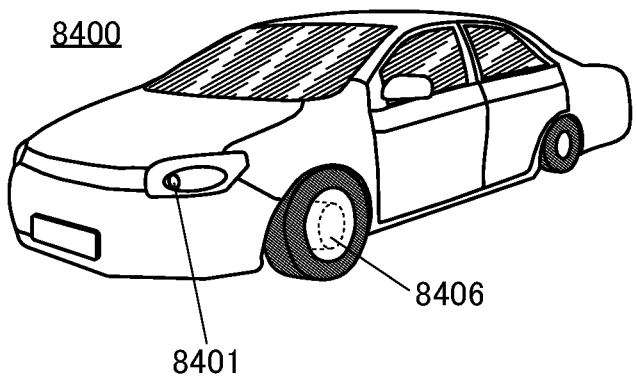
FIG. 17A is a diagram illustrating a vehicle of one embodiment of the present invention.
Figure 17B:
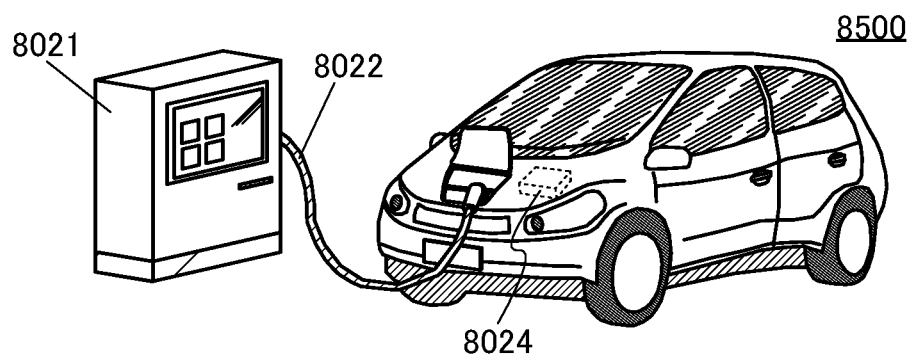
FIG. 17B is a diagram illustrating a vehicle of one embodiment of the present invention.
Figure 17C:
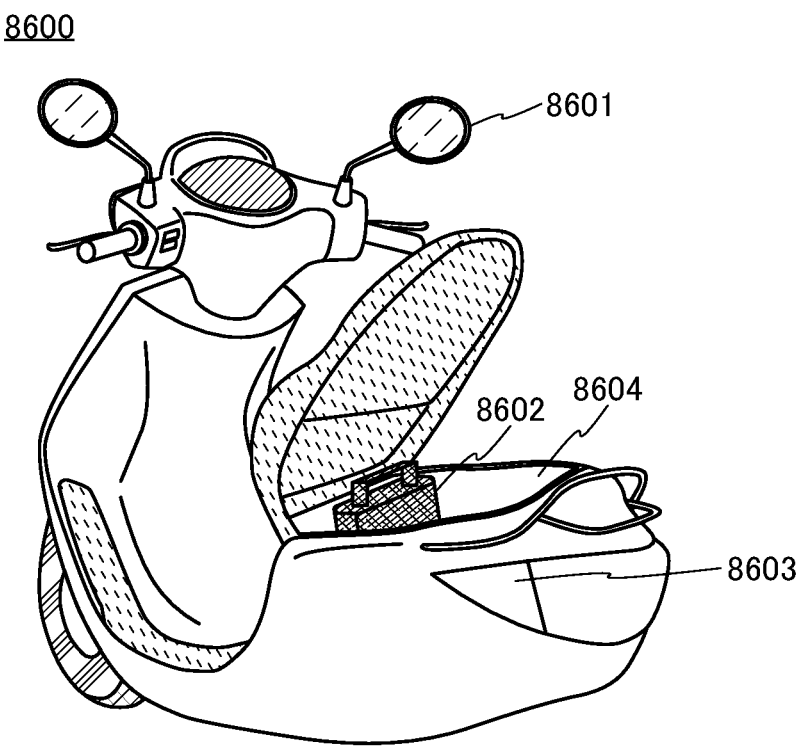
FIG. 17C is a diagram illustrating a vehicle of one embodiment of the present invention.

FIG. 17A, FIG. 17B, and FIG. 17C illustrate examples of vehicles using the power storage system which is one embodiment of the present invention. An automobile 8400 illustrated in FIG. 17A is an electric vehicle that runs on an electric motor as a power source. Alternatively, the automobile 8400 is a hybrid electric vehicle capable of driving appropriately using either an electric motor or an engine. The use of one embodiment of the present invention can achieve a high-mileage vehicle. The automobile 8400 includes a power storage system. The power storage system is used not only for driving an electric motor 8406, but also for supplying electric power to a light-emitting device such as a headlight 8401 or a room light (not illustrated).

The power storage system can also supply electric power to a display device of a speedometer, a tachometer, or the like included in the automobile 8400. Furthermore, the power storage system can supply electric power to a navigation system or the like included in the automobile 8400.

An automobile 8500 illustrated in FIG. 17B can be charged when the power storage system 8024 included in the automobile 8500 is supplied with electric power from external charging equipment by a plug-in system, a contactless power feeding system, or the like. FIG. 17B illustrates the state in which the power storage system 8024 included in the automobile 8500 is charged with aground-based charging apparatus 8021 through a cable 8022. In charge, a given method such as CHAdeMO (registered trademark) or Combined Charging System may be employed as a charging method, the standard of a connector, or the like as appropriate. The charging apparatus 8021 may be a charging station provided in a commerce facility or a power source in a house. With the use of a plug-in technique, the power storage system 8024 included in the automobile 8500 can be charged by being supplied with electric power from the outside, for example. The charge can be performed by converting AC electric power into DC electric power through a converter, such as an AC-DC converter.

Although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charge can be performed not only when the electric vehicle is stopped but also when driven. In addition, the contactless power feeding system may be utilized to perform transmission and reception of electric power between vehicles. A solar cell may be provided in the exterior of the automobile to charge the power storage system when the automobile stops or moves. To supply electric power in such a contactless manner, an electromagnetic induction method or a magnetic resonance method can be used.

FIG. 17C is an example of a two-wheeled vehicle using the power storage system of one embodiment of the present invention. A motor scooter 8600 illustrated in FIG. 17C includes a power storage system 8602, side mirrors 8601, and indicator lights 8603. The power storage system 8602 can supply electricity to the indicator lights 8603.

In the motor scooter 8600 illustrated in FIG. 17C, the power storage system 8602 can be stored in a storage unit under seat 8604. The power storage system 8602 can be stored in the storage unit under seat 8604 even with a small size.

Figure 18A:
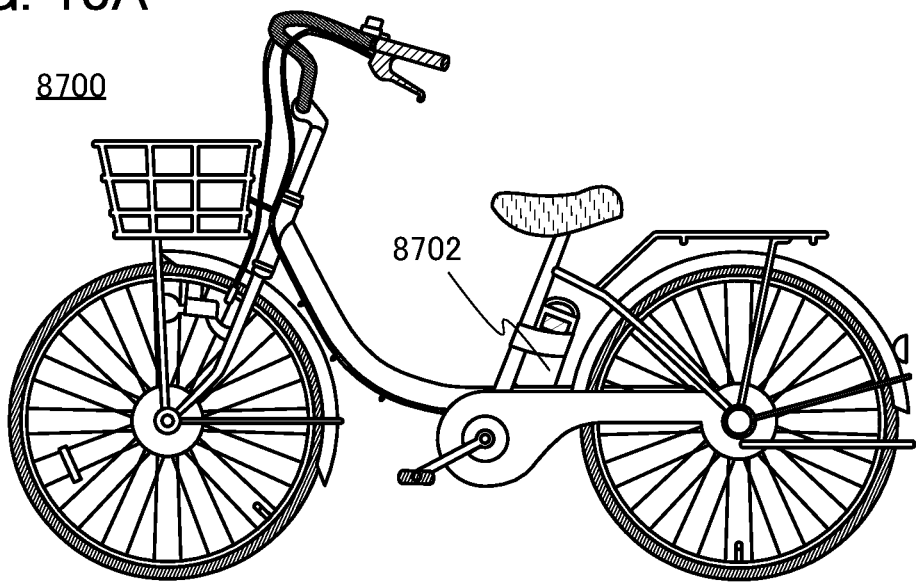
FIG. 18A is a diagram illustrating a vehicle of one embodiment of the present invention.

FIG. 18A is an example of an electric bicycle using the power storage system of one embodiment of the present invention. The power storage system of one embodiment of the present invention can be used for an electric bicycle 8700 illustrated in FIG. 18A. The power storage system of one embodiment of the present invention includes a plurality of storage batteries, a protective circuit, and a neural network, for example.

Figure 18B:
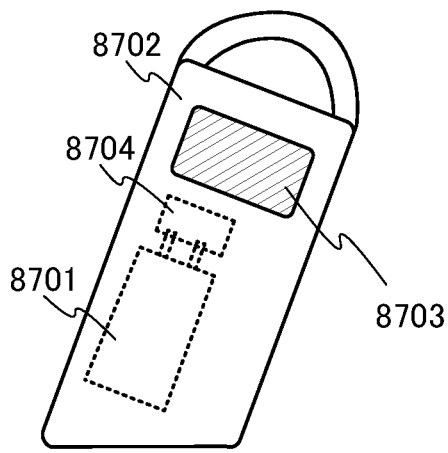
FIG. 18B is a diagram illustrating a power storage system of one embodiment of the present invention.

The electric bicycle 8700 includes a power storage system 8702. The power storage system 8702 can supply electricity to a motor that assists a rider. The power storage system 8702 is portable, and FIG. 18B illustrates the state where the power storage system 8702 is detached from the bicycle. A plurality of secondary batteries 8701 included in the power storage system of one embodiment of the present invention are incorporated in the power storage system 8702, and the remaining battery capacity and the like can be displayed on a display portion 8703. The power storage system 8702 also includes a control circuit 8704 of one embodiment of the present invention. The control circuit 8704 is electrically connected to a positive electrode and a negative electrode of the storage battery 8701. The battery control circuit described in the above embodiment can be used as the control circuit 8704.

This embodiment can be combined with any of the other embodiments as appropriate.

Embodiment 6

In this embodiment, examples of electronic devices each including the power storage system described in the above embodiments will be described.

Figure 19A:
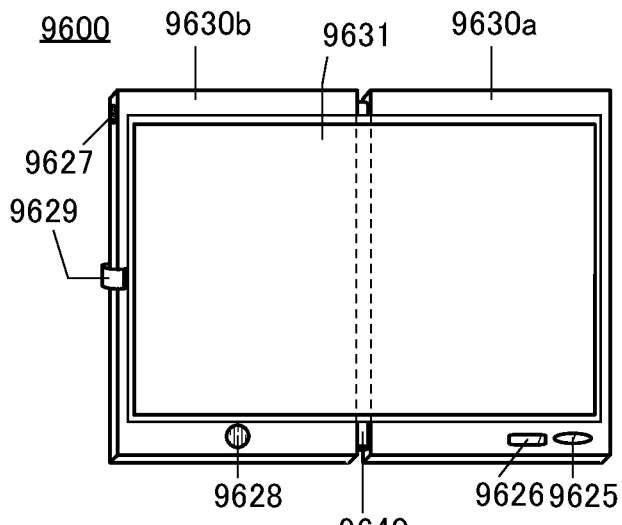
FIG. 19A is a diagram illustrating an electronic device of one embodiment of the present invention.
Figure 19B:
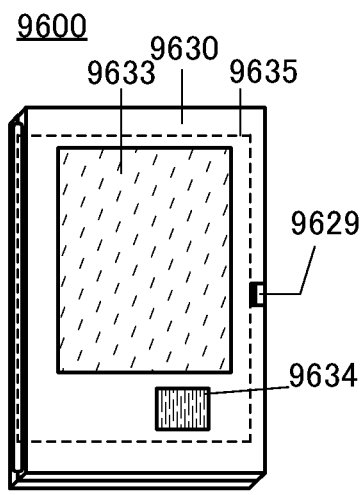
FIG. 19B is a diagram illustrating an electronic device of one embodiment of the present invention.

Next, FIG. 19A and FIG. 19B illustrate examples of a foldable tablet terminal (including a clamshell tablet). A tablet terminal 9600 illustrated in FIG. 19A and FIG. 19B includes a housing 9630*a*, a housing 9630*b*, a movable portion 9640 connecting the housing 9630*a* and the housing 9630*b*, a display portion 9631, a display mode changing switch 9626, a power switch 9627, a power saving mode changing switch 9625, a fastener 9629, and an operation switch 9628. A flexible panel is used for the display portion 9631, whereby a tablet terminal with a larger display portion can be provided. FIG. 19A illustrates the tablet terminal 9600 that is opened, and FIG. 19B illustrates the tablet terminal 9600 that is closed.

The tablet terminal 9600 includes a power storage unit 9635 inside the housing 9630*a* and the housing 9630*b*. The power storage unit 9635 is provided across the housing 9630*a* and the housing 9630*b*, passing through the movable portion 9640.

Part of the display portion 9631 can be a touch panel region and data can be input when a displayed operation key is touched. When a position where a keyboard display switching button is displayed on the touch panel is touched with a finger, a stylus, or the like, keyboard buttons can be displayed on the display portion 9631.

The display mode switch 9626 can switch the display between a portrait mode and a landscape mode, and between monochrome display and color display, for example. The power saving mode changing switch 9625 can control display luminance in accordance with the amount of external light in use, which is measured with an optical sensor incorporated in the tablet terminal 9600. Another detection device including a sensor for detecting inclination, such as a gyroscope sensor or an acceleration sensor, may be incorporated in the tablet terminal, in addition to the optical sensor.

FIG. 19B is a closed state and the tablet terminal includes the housing 9630, a solar cell 9633, and the power storage system of one embodiment of the present invention. The power storage system includes a control circuit 9634 and the power storage unit 9635. The battery control circuit described in the above embodiment can be used as the control circuit 9634.

The tablet terminal 9600 can be folded such that the housing 9630*a* and the housing 9630*b* overlap with each other when not in use. Thus, the display portion 9631 can be protected, which increases the durability of the tablet terminal 9600.

The tablet terminal illustrated in FIG. 19A and FIG. 19B can also have a function of displaying various kinds of information (a still image, a moving image, a text image, and the like), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, supplies electric power to a touch panel, a display portion, an image signal processor, and the like. Note that the solar cell 9633 can be provided on one or both surfaces of the housing 9630 and the power storage unit 9635 can be charged efficiently.

Figure 19C:
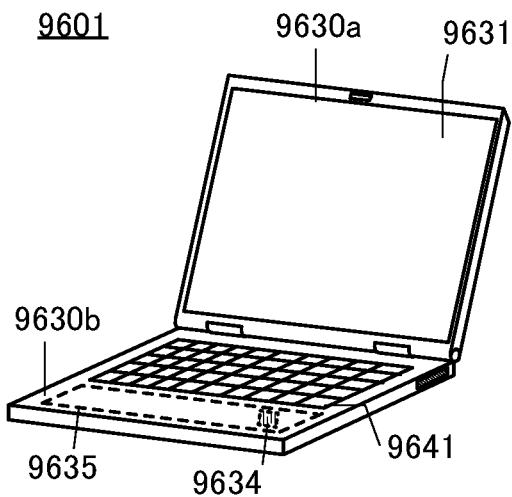
FIG. 19C is a diagram illustrating an electronic device of one embodiment of the present invention.

Note that although FIG. 19A and FIG. 19B illustrate a structure in which the battery control circuit described in the above embodiment is used for a foldable tablet terminal, another structure may be employed. For example, application to a clamshell laptop personal computer is possible as illustrated in FIG. 19C. FIG. 19C illustrates a laptop personal computer 9601 including a display portion 9631 in a housing 9630a and a keyboard portion 9641 in a housing 9630b. The laptop personal computer 9601 includes the control circuit 9634 and the power storage unit 9635 which are described with reference to FIG. 19A and FIG. 19B. The battery control circuit described in the above embodiment can be used as the control circuit 9634.

Figure 20:
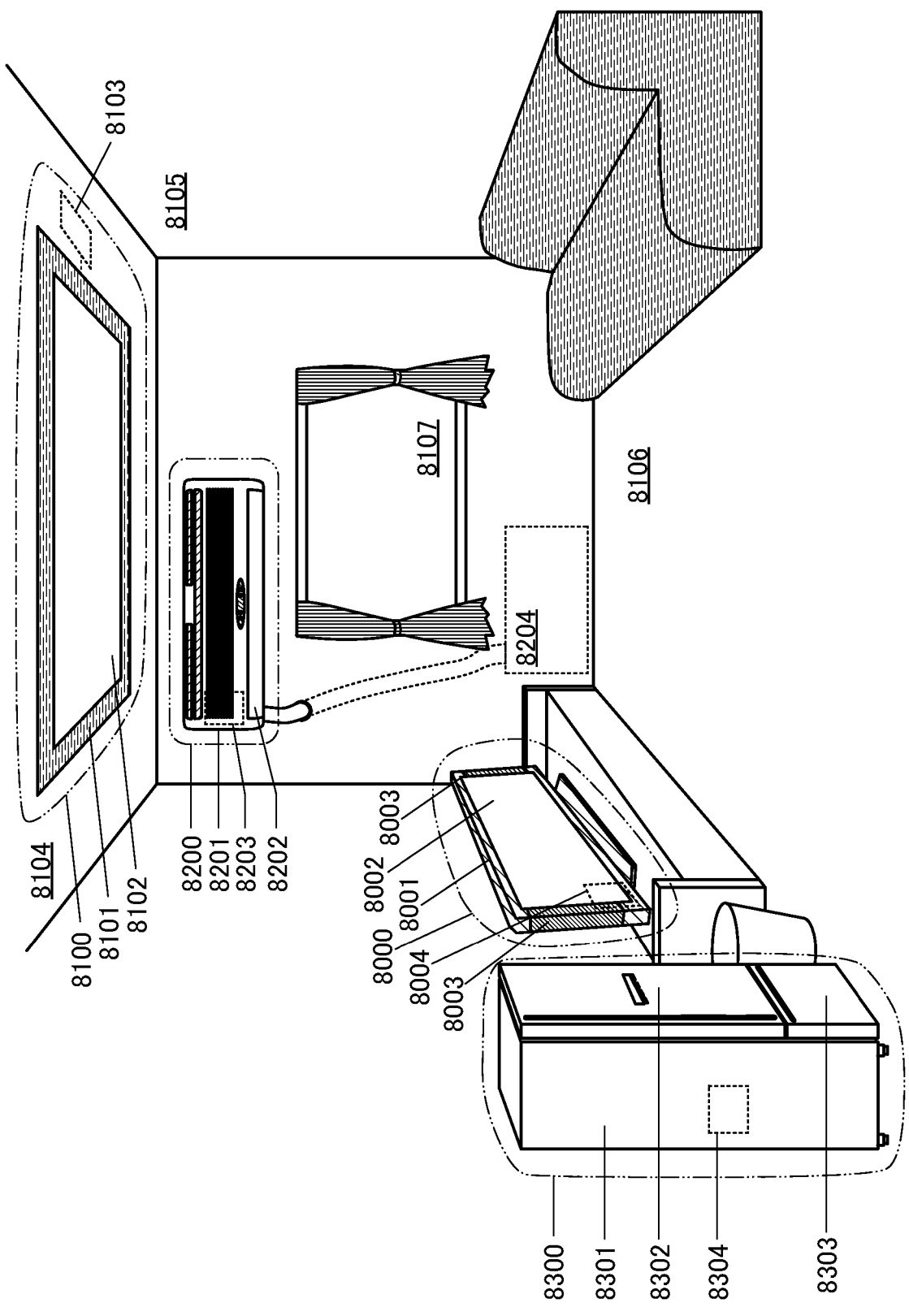
FIG. 20 is a diagram illustrating electronic devices of one embodiment of the present invention.

FIG. 20 illustrates other examples of electronic devices. In FIG. 20, a display device 8000 is an example of an electronic device including the power storage system of one embodiment of the present invention. Specifically, the display device 8000 corresponds to a display device for TV broadcast reception and includes a housing 8001, a display portion 8002, speaker portions 8003, the secondary battery 8004, and the like. A detection system according to one embodiment of the present invention is provided in the housing 8001. The display device 8000 can receive electric power from a commercial power supply. Alternatively, the display device 8000 can use electric power stored in the secondary battery 8004.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002.

An audio input device 8005 also uses a secondary battery. The audio input device 8005 includes the power storage system described in the above embodiments. The audio input device 8005 includes a plurality of sensors (an optical sensor, a temperature sensor, a humidity sensor, a pressure sensor, an illuminance sensor, a motion sensor, and the like) including a microphone, in addition to wireless communication elements. In accordance with an instruction spoken by a user, another device can be operated; for example, powering of the display device 8000 can be controlled, the amount of light of a lighting device 8100 can be controlled, or the like. The audio input device 8005 is capable of audio operation of a peripheral device and replaces a manual remote controller.

The audio input device 8005 includes a wheel or a mechanical transfer means and is configured to be capable of, while listening to an instruction precisely with the incorporated microphone by moving in the direction in which speaking by a user can be heard, displaying the content on a display portion 8008 or performing a touch input operation on the display portion 8008.

The audio input device 8005 can also function as a charging doc of a portable information terminal 8009 such as a smartphone. Electric power can be transmitted and received with a wire or wirelessly between the portable information terminal 8009 and the audio input device 8005. The portable information terminal 8009 is not particularly need to be carried indoors, and a load on the secondary battery and degradation thereof are desirably avoided while a necessary capacity is ensured. Thus, control or maintenance of the secondary battery or the like is desirably performed by the audio input device 8005. Since the audio input device 8005 includes the speaker 8007 and the microphone, hands-free conversation is possible even while the portable information terminal 8009 is charged. When the capacity of the secondary battery of the audio input device 8005 decreases, the audio input device 8005 moves in the direction indicated by the arrow and is charged by wireless charging from a charging module 8010 connected to an external power source.

The audio input device 8005 may be put on a stand. The audio input device 8005 may be provided with a wheel or a mechanical transfer means to move to a desired position. Alternatively, a stand or a wheel is not provided and the audio input device 8005 may be fixed to a desired position, for example, on the floor or the like.

Note that the display device includes, in its category, all of information display devices for personal computers, advertisement displays, and the like other than TV broadcast reception.

In FIG. 20, the tabletop lighting device 8100 is an example of an electronic device using a secondary battery 8103 which is controlled by a microprocessor that controls charge (including an APS). Specifically, the lighting device 8100 includes a housing 8101, alight source 8102, the secondary battery 8103, and the like. Although FIG. 20 illustrates the case where the secondary battery 8103 is provided in a roof 8104 on which the housing 8101 and the light source 8102 are installed, the secondary battery 8103 may be provided in the housing 8101. The lighting device 8100 can receive electric power from a commercial power supply. Alternatively, the lighting device 8100 can use electric power stored in the secondary battery 8103.

Note that although the tabletop lighting device 8100 provided on the roof 8104 is illustrated in FIG. 20 as an example, the secondary battery 8103 can be used as an installation lighting device provided in, for example, a sidewall 8105, a floor 8106, a window 8107, or the like other than the roof 8104. Alternatively, the secondary battery can be used in a tabletop lighting device or the like.

As the light source 8102, an artificial light source which emits light artificially by using power can be used. Specifically, an incandescent lamp, a discharge lamp such as a fluorescent lamp, and a light-emitting element such as an LED or an organic EL element are given as examples of the artificial light source.

In FIG. 20, an air conditioner including an indoor unit 8200 and an outdoor unit 8204 is an example of an electronic device using a secondary battery 8203. Specifically, the indoor unit 8200 includes a housing 8201, an air outlet 8202, the secondary battery 8203, and the like. Although FIG. 20 illustrates the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can receive electric power from a commercial power supply. Alternatively, the air conditioner can use electric power stored in the secondary battery 8203.

In FIG. 20, an electric refrigerator-freezer 8300 is an example of an electronic device using a secondary battery 8304. Specifically, the electric refrigerator-freezer 8300 includes a housing 8301, a door for refrigerator compartment 8302, a door for freezer compartment 8303, the secondary battery 8304, and the like. The secondary battery 8304 is provided in the housing 8301 in FIG. 20. The electric refrigerator-freezer 8300 can receive electric power from a commercial power supply. Alternatively, the electric refrigerator-freezer 8300 can use electric power stored in the secondary battery 8304.

In addition, in a time period when electronic devices are not used, particularly when the proportion of the amount of electric power which is actually used to the total amount of electric power which can be supplied from a commercial power source (such a proportion referred to as a usage rate of electric power) is low, electric power can be stored in the secondary battery, whereby an increase in the usage rate of electric power can be reduced in a time period when the electronic devices are used. For example, in the case of the electric refrigerator-freezer 8300, electric power can be stored in the secondary battery 8304 in night time when the temperature is low and the door for refrigerator compartment 8302 and the door for freezer compartment 8303 are not often opened and closed. On the other hand, in daytime when the temperature is high and the door for refrigerator compartment 8302 and the door for freezer compartment 8303 are frequently opened and closed, the secondary battery 8304 is used as an auxiliary power source; thus, the usage rate of electric power in daytime can be reduced.

A secondary battery can be provided in any electronic device other than the above-described electronic devices. According to one embodiment of the present invention, the secondary battery can have excellent cycle characteristics. Thus, the microprocessor that controls charge (including an APS) of one embodiment of the present invention is mounted on the electronic device described in this embodiment, whereby an electronic device with a longer lifetime can be obtained. This embodiment can be implemented in appropriate combination with the other embodiments.

FIGS. 21A to 21E show examples of electronic devices including the power storage system of one embodiment of the present invention. Examples of electronic devices to which the power storage system of one embodiment of the present invention is applied are television sets (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, and large game machines such as pachinko machines, and the like.

Figure 21A:
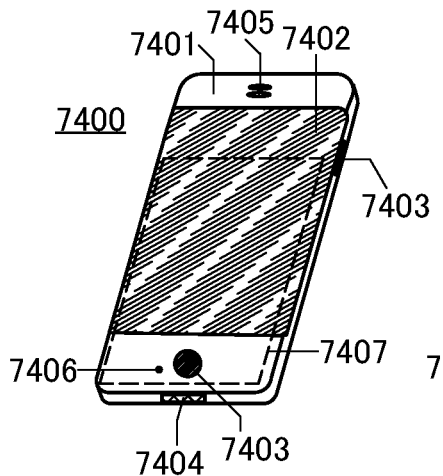
FIG. 21A is a diagram illustrating an electronic device of one embodiment of the present invention.

FIG. 21A illustrates an example of a mobile phone. A mobile phone 7400 includes operation buttons 7403, an external connection port 7404, a speaker 7405, a microphone 7406, and the like in addition to a display portion 7402 incorporated in a housing 7401. The mobile phone 7400 includes the power storage system of one embodiment of the present invention. The power storage system of one embodiment of the present invention includes a storage battery 7407 and the battery control circuit described in the above embodiment.

Figure 21B:
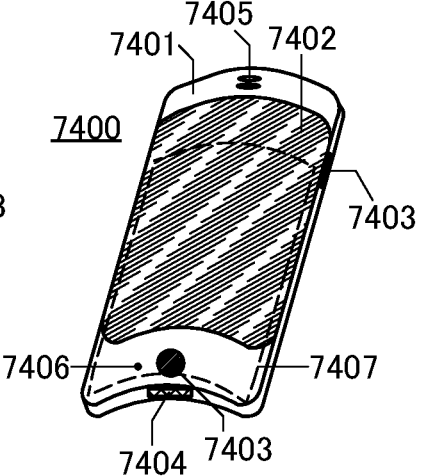
FIG. 21B is a diagram illustrating an electronic device of one embodiment of the present invention.
Figure 21C:
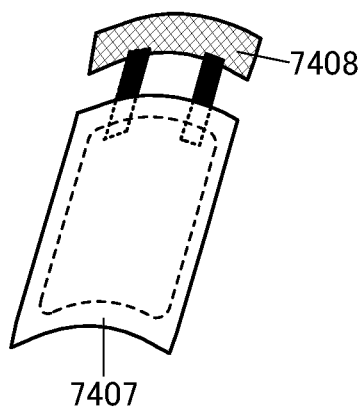
FIG. 21C is a diagram illustrating a secondary battery of one embodiment of the present invention.

FIG. 21B illustrates the state where the mobile phone 7400 is curved. When the mobile phone 7400 is entirely curved by external force, the storage battery 7407 provided therein may also be curved. In such a case, a storage battery having flexibility is preferably used as the storage battery 7407. FIG. 21C illustrates the state where the storage battery having flexibility is curved. A control circuit 7408 is electrically connected to the storage battery. The battery control circuit described in the above embodiment can be used as the control circuit 7408.

A storage battery having a flexible shape can also be incorporated along a curved inside/outside wall surface of a house or a building or a curved interior/exterior surface of an automobile.

Figure 21D:
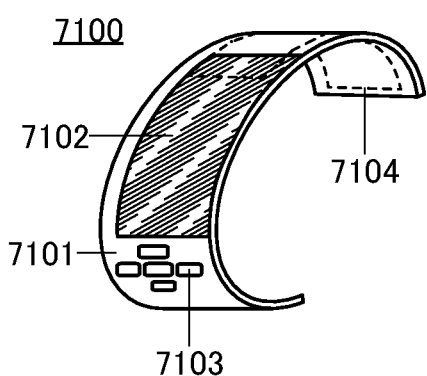
FIG. 21D is a diagram illustrating an electronic device of one embodiment of the present invention.

FIG. 21D illustrates an example of a bangle-type display device. A portable display device 7100 includes a housing 7101, a display portion 7102, operation buttons 7103, and the power storage system of one embodiment of the present invention. The power storage system of one embodiment of the present invention includes a storage battery 7104 and the battery control circuit described in the above embodiment.

Figure 21E:
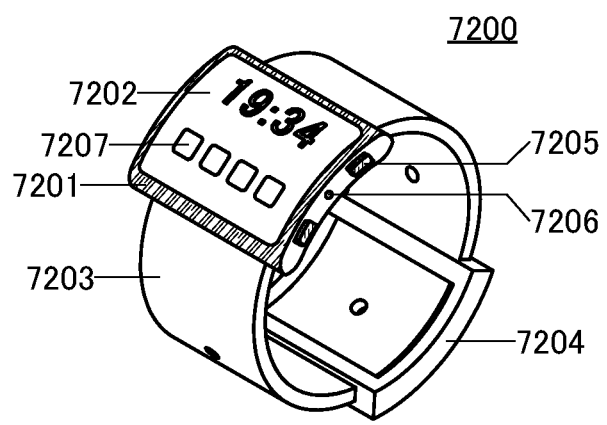
FIG. 21E is a diagram illustrating an electronic device of one embodiment of the present invention.

FIG. 21E shows an example of a watch-type portable information terminal. A portable information terminal 7200 includes a housing 7201, a display portion 7202, a band 7203, a buckle 7204, an operation button 7205, an input output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is curved, and images can be displayed on the curved display surface. The display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off, on/off of wireless communication, setting and cancellation of a silent mode, and setting and cancellation of a power saving mode can be performed. For example, the functions of the operation button 7205 can be set freely by setting the operation system incorporated in the portable information terminal 7200.

The portable information terminal 7200 can employ near field communication that is a communication method based on an existing communication standard. For example, mutual communication between the portable information terminal and a headset capable of wireless communication can be performed, and thus hands-free calling is possible.

The portable information terminal 7200 includes the input output terminal 7206, and data can be directly transmitted to and received from another information terminal via a connector. In addition, charge via the input output terminal 7206 is possible. The charge operation may be performed by wireless power feeding without using the input output terminal 7206.

The portable information terminal 7200 includes the power storage system of one embodiment of the present invention. The power storage system includes a storage battery and the battery control circuit described in the above embodiment.

The portable information terminal 7200 preferably includes a sensor. As the sensor, for example, a human body sensor such as a fingerprint sensor, a pulse sensor, or a temperature sensor, a touch sensor, a pressure sensitive sensor, an acceleration sensor, or the like is preferably mounted.

This embodiment can be combined with any of the other embodiments as appropriate.

SUPPLEMENTARY NOTES ON THE DESCRIPTION IN THIS SPECIFICATION AND THE LIKE

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" includes the case where electric signals can be transmitted and received between A and B when an object having any electric action exists between A and B.

REFERENCE NUMERALS

100: power storage device, 110: battery control circuit, 111: voltage comparison unit, 113: comparator, 113-1: comparator, 113-2: comparator, 113-3: comparator, 114: memory element, 114-1: memory element, 114-2: memory element, 114-3: memory element, 120: assembled battery, 121: battery cell, 121(k): battery cell, 161: capacitor, 162: transistor, 119: voltage generation circuit, 130: cell-balance circuit, 130(k): cell-balance circuit, 131: resistor, 132: transistor, 140: transistor, 150: transistor, 170: control circuit, 171: capacitor, 172: transistor, 173: comparator, 174: memory element, 181: detection circuit, 185: detection circuit, 186: detection circuit, 190: digital-analog conversion circuit, 195: sensor circuit, 195-1: sensor circuit, 195-2: sensor circuit, 195-3: sensor circuit, 196: transistor, 197: capacitor.

The invention claimed is:

1. A semiconductor device comprising:
   a first cell-balance circuit;
   a second cell-balance circuit;
   a voltage generation circuit;
   a first secondary battery electrically connected to the first cell-balance circuit; and
   a second secondary battery electrically connected to the second cell-balance circuit, wherein the first cell-balance circuit comprises:
  a first comparison circuit;
  a first terminal electrically connected to a non-inverting input terminal of the first comparison circuit;
  a first transistor comprising a metal oxide comprising indium in a channel formation region, one of a source and a drain of the first transistor electrically connected to an inverting input terminal of the first comparison circuit;
  a first capacitor, one electrode of the first capacitor electrically connected to the inverting input terminal of the first comparison circuit;
  a second terminal electrically connected to the other electrode of the first capacitor; and
  a third terminal electrically connected to the other one of the source and the drain of the first transistor,
wherein a positive electrode of the first secondary battery is electrically connected to the first terminal,
wherein a negative electrode of the first secondary battery is electrically connected to the second terminal,
wherein the second cell-balance circuit comprises:
  a second comparison circuit;
  the second terminal is electrically connected to a non-inverting input terminal of the second comparison circuit;
  a second transistor comprising a metal oxide comprising indium in a channel formation region, one of a source and a drain of the second transistor electrically connected to an inverting input terminal of the second comparison circuit;
  a second capacitor, one electrode of the second capacitor electrically connected to the inverting input terminal of the second comparison circuit;
  a fourth terminal electrically connected to the other electrode of the second capacitor; and
  a fifth terminal electrically connected to the other one of the source and the drain of the second transistor,
wherein a positive electrode of the second secondary battery is electrically connected to the second terminal,
wherein a negative electrode of the second secondary battery is electrically connected to the fourth terminal,
wherein the voltage generation circuit comprises a third transistor and a third capacitor,
wherein one electrode of the third capacitor is electrically connected to one of a source and a drain of the third transistor,
wherein the second terminal is electrically connected to the other of the source and the drain of the third transistor,
wherein the voltage generation circuit is configured to generate a voltage, the voltage is supplied from the third terminal, and
wherein the third transistor comprises a metal oxide comprising indium in a channel formation region.

2. The semiconductor device according to claim 1,
wherein in the case where the voltage is supplied from the third terminal, the voltage is input to the inverting input terminal of the first comparison circuit,
wherein the voltage input to the inverting input terminal of the first comparison circuit is a sum of a voltage of the second terminal and a predetermined voltage, and
wherein the predetermined voltage is a voltage as a difference in a voltage between the positive electrode of the first secondary battery and the negative electrode of the first secondary battery.

3. The semiconductor device according to claim 2,
wherein in the case where a voltage of the positive electrode of the first secondary battery is higher than or equal to the voltage input to the inverting input terminal of the first comparison circuit, a high-potential signal is output from the first comparison circuit.

4. The semiconductor device according to claim 1,
wherein in the case where the voltage is supplied from the third terminal, the voltage is input to the inverting input terminal of the first comparison circuit,
wherein in the case where a voltage is supplied from the fifth terminal, the voltage is input to the inverting input terminal of the second comparison circuit,
wherein the voltage input to the inverting input terminal of the first comparison circuit is a sum of a voltage of the second terminal and a first predetermined voltage,
wherein the voltage input to the inverting input terminal of the second comparison circuit is a sum of a voltage of the fourth terminal and a second predetermined voltage,
wherein the first predetermined voltage is a voltage as a difference in a voltage between the positive electrode of the first secondary battery and the negative electrode of the first secondary battery,
wherein the second predetermined voltage is a voltage as a difference in a voltage between the positive electrode of the second secondary battery and the negative electrode of the second secondary battery, and
wherein in the case where a potential of the second terminal is higher than the voltage input to the inverting input terminal of the second comparison circuit, a high-potential signal is output from the second comparison circuit.

5. A semiconductor device comprising:
a first cell-balance circuit;
a second cell-balance circuit;
a voltage generation circuit;
a first secondary battery electrically connected to the first cell-balance circuit; and
a second secondary battery electrically connected to the second cell-balance circuit,
wherein the first cell-balance circuit comprises:
  a first comparison circuit;
  a first terminal electrically connected to a non-inverting input terminal of the first comparison circuit;
  a first transistor comprising a metal oxide comprising indium in a channel formation region, one of a source and a drain of the first transistor electrically connected to an inverting input terminal of the first comparison circuit;
  a first capacitor, one electrode of the first capacitor electrically connected to the inverting input terminal of the first comparison circuit;
  a second terminal electrically connected to the other electrode of the first capacitor; and
  a third terminal electrically connected to the other one of the source and the drain of the first transistor,
wherein a positive electrode of the first secondary battery is electrically connected to the first terminal,
wherein a negative electrode of the first secondary battery is electrically connected to the second terminal,
wherein the second cell-balance circuit comprises:
  a second comparison circuit;
  the second terminal is electrically connected to a non-inverting input terminal of the second comparison circuit;
  a second transistor comprising a metal oxide comprising indium in a channel formation region, one of a source and a drain of the second transistor electrically connected to an inverting input terminal of the second comparison circuit;

a second capacitor, one electrode of the second capacitor electrically connected to the inverting input terminal of the second comparison circuit;

a fourth terminal electrically connected to the other electrode of the second capacitor; and a fifth terminal electrically connected to the other one of the source and the drain of the second transistor, wherein a positive electrode of the second secondary battery is electrically connected to the second terminal, wherein a negative electrode of the second secondary battery is electrically connected to the fourth terminal, wherein the voltage generation circuit comprises a third comparison circuit, wherein one of a source and a drain of a third transistor is electrically connected to a non-inverting input terminal of the third comparison circuit, wherein the third terminal is electrically connected to an inverting input terminal of the third comparison circuit, and wherein a gate of the first transistor of the first cell-balance circuit is electrically connected to an output terminal of the third comparison circuit.

6. The semiconductor device according to claim 5, wherein in the case where the voltage is supplied from the third terminal, the voltage is input to the inverting input terminal of the first comparison circuit, wherein the voltage input to the inverting input terminal of the first comparison circuit is a sum of a voltage of the second terminal and a predetermined voltage, and wherein the predetermined voltage is a voltage as a difference in a voltage between the positive electrode of the first secondary battery and the negative electrode of the first secondary battery.

7. The semiconductor device according to claim 6, wherein in the case where a voltage of the positive electrode of the first secondary battery is higher than or equal to the voltage input to the inverting input terminal of the first comparison circuit, a high-potential signal is output from the first comparison circuit.

8. The semiconductor device according to claim 5, wherein in the case where the voltage is supplied from the third terminal, the voltage is input to the inverting input terminal of the first comparison circuit, wherein in the case where a voltage is supplied from the fifth terminal, the voltage is input to the inverting input terminal of the second comparison circuit, wherein the voltage input to the inverting input terminal of the first comparison circuit is a sum of a voltage of the second terminal and a first predetermined voltage, wherein the voltage input to the inverting input terminal of the second comparison circuit is a sum of a voltage of the fourth terminal and a second predetermined voltage, wherein the first predetermined voltage is a voltage as a difference in a voltage between the positive electrode of the first secondary battery and the negative electrode of the first secondary battery, wherein the second predetermined voltage is a voltage as a difference in a voltage between the positive electrode of the second secondary battery and the negative electrode of the second secondary battery, and wherein in the case where a potential of the second terminal is higher than the voltage input to the inverting input terminal of the second comparison circuit, a high-potential signal is output from the second comparison circuit.

\* \* \* \* \*